United States Patent
Chen et al.

(10) Patent No.: US 11,375,047 B2
(45) Date of Patent: Jun. 28, 2022

(54) DATA TRANSMISSION METHOD, APPARATUS, AND SYSTEM

(71) Applicant: Huawei Technologies Co., Ltd., Guangdong (CN)

(72) Inventors: Wei Chen, Chengdu (CN); Yihua Zhang, Chengdu (CN); Yongjun Tu, Chengdu (CN); Xin Luo, Chengdu (CN); Kai Qi, Chengdu (CN)

(73) Assignee: HUAWEI TECHNOLOGIES CO., LTD., Guangdong (CN)

( * ) Notice: Subject to any disclaimer, the term of this patent is extended or adjusted under 35 U.S.C. 154(b) by 86 days.

(21) Appl. No.: 16/130,692

(22) Filed: Sep. 13, 2018

(65) Prior Publication Data

US 2019/0014194 A1    Jan. 10, 2019

Related U.S. Application Data

(63) Continuation of application No. PCT/CN2016/076297, filed on Mar. 14, 2016.

(51) Int. Cl.
*H04L 69/04*    (2022.01)
*H04L 9/40*    (2022.01)
(Continued)

(52) U.S. Cl.
CPC .......... *H04L 69/04* (2013.01); *H03M 13/09* (2013.01); *H04L 1/0061* (2013.01); *H04L 29/06* (2013.01); *H04L 47/32* (2013.01); *H04L 69/22* (2013.01)

(58) Field of Classification Search
CPC ....... H04L 69/04; H04L 1/0061; H04L 29/06; H04L 47/32; H04L 69/22; H03M 13/09
(Continued)

(56) References Cited

U.S. PATENT DOCUMENTS 5,093,831 A * 3/1992 Serizawa ............. H03M 13/09
                                                                714/771
2003/0198250 A1    10/2003 Hakenberg et al.
(Continued)

FOREIGN PATENT DOCUMENTS

CN        101707616 A      5/2010
CN        101860904 A      10/2010
(Continued)

*Primary Examiner* — Joseph L Greene
(74) *Attorney, Agent, or Firm* — Womble Bond Dickinson (US) LLP

(57) ABSTRACT

A method of data transmission includes: receiving a first packet, where the first packet includes first compressed data and a first check value, the first compressed data is obtained by compressing first data based on a first compression mode, the first check value is obtained by processing a second check value based on a first check algorithm, the second check value is obtained by processing the first compressed data based on a second check algorithm; obtaining a first check code by processing the first packet based on a third check algorithm; determining, according to a correspondence between the first check code and the first compression mode, that the first compression mode is a compression mode used when the first data is compressed; and obtaining the first data by decompressing, based on a first decompression mode corresponding to the first compression mode, the first compressed data included in the first packet.

16 Claims, 7 Drawing Sheets

(51) Int. Cl.
*H03M 13/09* (2006.01)
*H04L 1/00* (2006.01)
*H04L 47/32* (2022.01)
*H04L 69/22* (2022.01)

(58) Field of Classification Search
USPC .......................................................... 709/247
See application file for complete search history.

(56) References Cited

U.S. PATENT DOCUMENTS

| | | | | |
|---|---|---|---|---|
| 2007/0274401 A1* | 11/2007 | Lee | ................... | H03M 13/2918 |
| | | | | 375/240.27 |
| 2010/0067525 A1* | 3/2010 | Matsui | .................... | H04L 65/80 |
| | | | | 370/389 |
| 2010/0180166 A1* | 7/2010 | Wand | ................... | H03M 7/3053 |
| | | | | 714/704 |
| 2010/0205497 A1* | 8/2010 | Li | ........................... | H04L 69/04 |
| | | | | 714/746 |
| 2012/0177064 A1 | 7/2012 | Shi et al. | | |
| 2012/0275424 A1* | 11/2012 | Chen | ..................... | H04W 28/06 |
| | | | | 370/329 |
| 2012/0294211 A1* | 11/2012 | Zhu | ......................... | H04L 69/22 |
| | | | | 370/310 |
| 2013/0007076 A1* | 1/2013 | Wegener | ................ | H03M 7/30 |
| | | | | 708/203 |
| 2013/0077601 A1 | 3/2013 | Chin et al. | | |
| 2013/0279516 A1 | 10/2013 | Shi | | |
| 2015/0195326 A1* | 7/2015 | Suryavanshi | ....... | H04L 43/0852 |
| | | | | 709/231 |

FOREIGN PATENT DOCUMENTS

| | | |
|---|---|---|
| CN | 102025737 A | 4/2011 |
| CN | 102036307 A | 4/2011 |
| CN | 102377651 A | 3/2012 |
| CN | 102938683 A | 2/2013 |
| CN | 103384884 A | 11/2013 |
| CN | 104038307 A | 9/2014 |
| EP | 2642788 A1 | 9/2013 |
| JP | 2003304299 A | 10/2003 |

\* cited by examiner

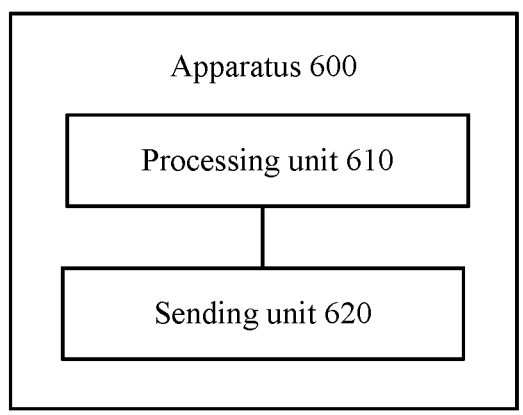
FIG. 6
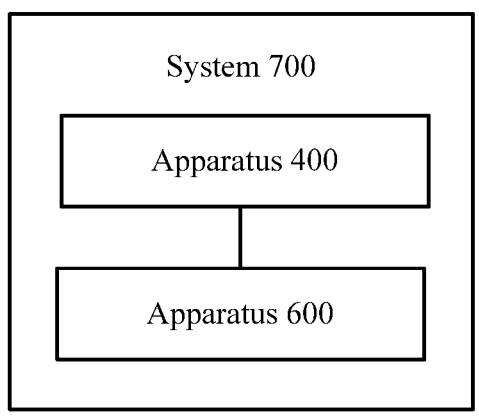 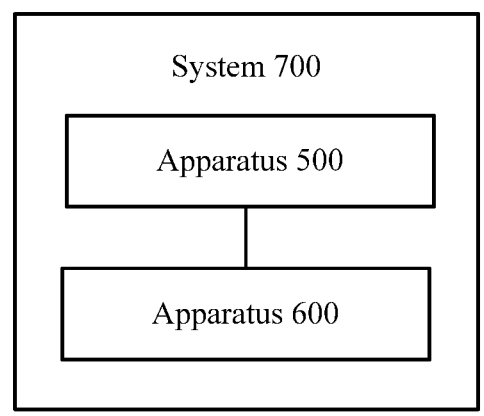
FIG. 7a  FIG. 7b

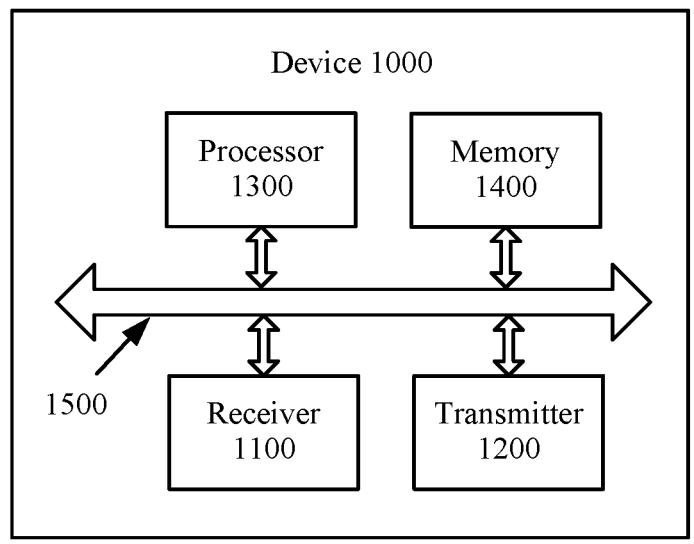
FIG. 10
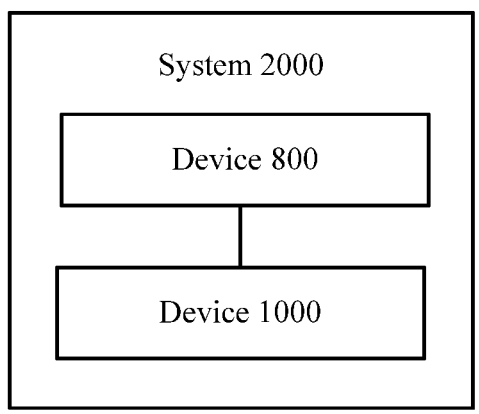 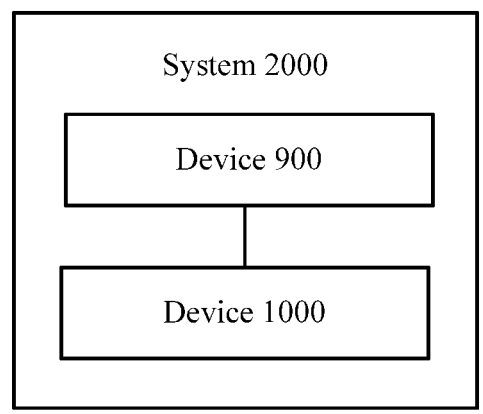
FIG. 11a  FIG. 11b

DATA TRANSMISSION METHOD, APPARATUS, AND SYSTEM

CROSS-REFERENCE TO RELATED APPLICATIONS

This application is a continuation of International Application No. PCT/CN2016/076297, filed on Mar. 14, 2016, the disclosure of which is incorporated herein by reference in its entirety.

TECHNICAL FIELD

The present disclosure relates to the communications field, and more specifically, to a data transmission method, apparatus and system.

BACKGROUND

In a point-to-point transmission system using the Ethernet Protocol, a sending device sends a packet to a receiving device. The packet includes compressed data. The sending device may support at least two compression modes. A compression mode supported by the sending device may be Ethernet frame header compression, Internet Protocol (IP) header compression, or payload compression. Specifically, the sending device obtains compressed data by compressing to-be-transmitted data by using a compression mode, and the sending device sends a packet including the compressed data to the receiving device. The receiving device needs to know the compression mode used by the sending device, so as to decompress the received compressed data by using a decompression mode corresponding to the compression mode.

Generally, a packet header of the packet generated by the sending device carries an overhead byte indicating the compression mode used by the sending device. The receiving device determines, according to the overhead byte carried in the packet header of the received packet, the compression mode used by the sending device. Overheads are relatively high in the foregoing solution.

SUMMARY

This disclosure provides a data transmission method, apparatus, and system, to reduce overheads.

According to a first aspect, this disclosure provides a data transmission method, and the method includes: receiving, by a receiving device, a first packet sent by a sending device, where the first packet includes first compressed data and a first check value, the first compressed data is obtained by the sending device by compressing first data based on a first compression mode, the first check value is obtained by the sending device by processing a second check value based on a first check algorithm, and the second check value is obtained by the sending device by processing the first compressed data based on a second check algorithm; obtaining, by the receiving device, a first check code by processing the first packet based on a third check algorithm, where the second check algorithm and the third check algorithm include a same generator polynomial; determining, by the receiving device according to the obtained first check code and a correspondence between the first check code and the first compression mode, that the first compression mode is a compression mode used when the sending device compresses the first data; and obtaining, by the receiving device, the first data by decompressing, based on a first decompression mode, the first compressed data included in the first packet, where the first decompression mode is a decompression mode corresponding to the first compression mode.

Therefore, the sending device generates a check value based on a check algorithm corresponding to a compression mode, and sends a packet including the check value and compressed data to the receiving device. The receiving device obtains, by processing the check value, a check code used to determine the compression mode. The receiving device determines, according to a correspondence between the check code and the compression mode, the compression mode used when the sending device compresses the data. Compared with the prior art in which a compression mode is indicated by using an extra overhead byte in a packet header, the indication information is carried by using the check value in the present disclosure, so that overheads are reduced. In addition, in the prior art, sufficient overhead bytes need to be reserved for extra overhead bytes in the packet header during system planning. If sufficient overhead bytes are not reserved during system planning, the compression mode cannot be indicated by using this method. In the present disclosure, no overhead byte needs to be reserved during system planning, so that system compatibility and extensibility are implemented.

In one embodiment, the sending device obtains the first compressed data by compressing the first data based on the first compression mode includes: the sending device obtains the first compressed data by compressing a target field in a packet carrying the first data, where the target field includes S bits, and a compressed target field is of M bits, and S is greater than M.

Therefore, the sending device may replace content in the target field with a short compressed field, so that fewer bandwidths are used in a transmission process, and bandwidth utilization is improved.

In another embodiment, determining, by the receiving device according to the obtained first check code and a correspondence between the first check code and the first compression mode, that the first compression mode is a compression mode used when the sending device compresses the first data includes: obtaining, by the receiving device, a one-to-one correspondence between a plurality of check codes and a plurality of compression modes, where the plurality of check codes include the first check code; and determining, by the receiving device according to the one-to-one correspondence between the plurality of check codes and the plurality of compression modes, that the first compression mode corresponding to the first check code is the compression mode used when the sending device compresses the first data.

Therefore, the sending device generates different check values based on check algorithms corresponding to different compression modes. The receiving device obtains different check codes by processing the different check values. The receiving device may determine, according to a correspondence between the different check codes and the different compression modes, a compression mode used in compressed data currently sent by the sending device. Therefore, overheads are reduced, and system compatibility and extensibility are implemented.

In yet another embodiment, after the determining, by the receiving device according to the obtained first check code and a correspondence between the first check code and the first compression mode, that the first compression mode is a compression mode used when the sending device compresses the first data, and before the obtaining, by the receiving device, the first data by decompressing, based on a first decompression mode, the first compressed data included in the first packet, the method further includes: determining, by the receiving device, that a second decompression mode currently used by the receiving device is different from the first decompression mode corresponding to the first compression mode that is used when the sending device compresses the first data and that is determined by the receiving device; and setting, by the receiving device, the decompression mode currently used by the receiving device to the first decompression mode on the basis that the second decompression mode currently used by the receiving device is different from the first decompression mode.

Therefore, when determining that the currently used second decompression mode is different from the first decompression mode, the receiving device sets the currently used decompression mode to the first decompression mode, so that the receiving device can obtain data from a next packet based on the first decompression mode when receiving the next packet sent by the sending device.

Further, the method further includes: when determining that the first check code is one of the plurality of check codes, determining, by the receiving device, that the first compressed data received by the receiving device is the same as the first compressed data sent by the sending device.

Therefore, when determining, according to the first check code, the compression mode used when the sending device compresses the first data, the receiving device may further check whether the first compressed data is correctly transmitted.

In still another embodiment, after the determining, by the receiving device, that a second decompression mode currently used by the receiving device is different from the first decompression mode corresponding to the first compression mode that is used when the sending device compresses the first data and that is determined by the receiving device, and before the setting, by the receiving device, the decompression mode currently used by the receiving device to the first decompression mode on the basis that the second decompression mode currently used by the receiving device is different from the first decompression mode, the method further includes: discarding, by the receiving device, the first packet.

Therefore, after receiving the first packet, and when determining that the decompression mode currently used by the receiving device is different from the first decompression mode, the receiving device discards the first packet. Therefore, the receiving device is prevented from decompressing the first compressed data by using an incorrect decompression mode, so as to avoid a network exception caused by a leakage of an incorrect data packet into a normal network.

In another embodiment, before the setting, by the receiving device, the decompression mode currently used by the receiving device to the first decompression mode on the basis that the second decompression mode currently used by the receiving device is different from the first decompression mode, the method further includes: receiving, by the receiving device, a second packet sent by the sending device, where the second packet includes second compressed data and a third check value, the second compressed data is obtained by the sending device by compressing second data based on the first compression mode, the third check value is obtained by the sending device by processing a fourth check value based on the first check algorithm, and the fourth check value is obtained by the sending device by processing the second compressed data based on the second check algorithm; obtaining, by the receiving device, the first check code by processing the second packet based on the third check algorithm; and determining, by the receiving device according to the obtained first check code and the correspondence between the first check code and the first compression mode, that the first compression mode is a compression mode used when the sending device compresses the second data; and the setting, by the receiving device, the decompression mode currently used by the receiving device to the first decompression mode on the basis that the second decompression mode currently used by the receiving device is different from the first decompression mode includes: setting, by the receiving device, the decompression mode currently used by the receiving device to the first decompression mode on the basis that the second decompression mode currently used by the receiving device is different from the first decompression mode corresponding to the first compression mode that is used when the sending device compresses the first data and that is determined by the receiving device, and that the second decompression mode currently used by the receiving device is different from the first decompression mode corresponding to the first compression mode that is used when the sending device compresses the second data and that is determined by the receiving device.

Therefore, the receiving device continuously determines, twice according to two packets continuously sent by the sending device, that compression modes used by the sending device are the first compression mode. The receiving device switches the currently used decompression mode to the first decompression mode corresponding to the first compression mode, so as to avoid a case in which the compression mode used by the sending device cannot be correctly determined based on a check value caused by a network transmission error, and reduce a probability of false determining and false switching performed by the receiving device.

According to a second aspect, this disclosure provides a data transmission method, and the method includes: receiving, by a receiving device, a first packet sent by a sending device, where the first packet includes first compressed data and a first check value, the first compressed data is obtained by the sending device by compressing first data based on a first compression mode, the first check value is obtained by the sending device by processing a second check value based on a first check algorithm, and the second check value is obtained by the sending device by processing the first compressed data based on a second check algorithm; obtaining, by the receiving device, the second check value by processing, based on the second check algorithm, the first compressed data included in the first packet; obtaining, by the receiving device, the first check value by processing the obtained second check value based on the first check algorithm; determining, by the receiving device on the basis that the obtained first check value is the same as the first check value included in the first packet, that the first check algorithm is a check algorithm used when the sending device generates the first packet; determining, by the receiving device according to the first check algorithm that is used when the sending device generates the first packet and that is determined by the receiving device and a correspondence between the first check algorithm and the first compression mode, that the first compression mode is a compression mode used when the sending device compresses the first data; and obtaining, by the receiving device, the first data by decompressing, based on a first decompression mode, the first compressed data included in the first packet, where the first decompression mode is a decompression mode corresponding to the first compression mode.

Therefore, the sending device generates a check value based on a check algorithm corresponding to a compression mode, and sends a packet including the check value and compressed data to the receiving device. The receiving device processes the compressed data in the packet to determine a check algorithm the same as that used by the sending device. The receiving device determines, according to a correspondence between the check algorithm and the compression mode, the compression mode used when the sending device compresses the data. Compared with the prior art in which a compression mode is indicated by using an extra overhead byte in a packet header, the indication information is carried by using the check value in the present disclosure, so that overheads are reduced. In addition, in the prior art, sufficient overhead bytes need to be reserved for extra overhead bytes in the packet header during system planning. If sufficient overhead bytes are not reserved during system planning, the compression mode cannot be indicated by using this method. In the present disclosure, no overhead byte needs to be reserved during system planning, so that system compatibility and extensibility are implemented.

In one embodiment, obtaining, by the receiving device, the first check value by processing the obtained second check value based on the first check algorithm includes: obtaining, by the receiving device, a plurality of check values by separately processing the second check value based on a plurality of check algorithms, where the plurality of check values include the first check value, and the plurality of check values correspond one-to-one to the plurality of check algorithms.

In another embodiment, after the determining, by the receiving device according to the first check algorithm that is used by the sending device and that is determined by the receiving device and a correspondence between the first check algorithm and the first compression mode, that the first compression mode is a compression mode used when the sending device compresses the first data, and before the obtaining, by the receiving device, the first data by decompressing, based on a first decompression mode, the first compressed data included in the first packet, the method further includes: determining, by the receiving device, that a second decompression mode currently used by the receiving device is different from the first decompression mode corresponding to the first compression mode that is used when the sending device compresses the first data and that is determined by the receiving device; and setting, by the receiving device, the decompression mode currently used by the receiving device to the first decompression mode on the basis that the second decompression mode currently used by the receiving device is different from the first decompression mode.

Therefore, when determining that the currently used second decompression mode is different from the first decompression mode, the receiving device sets the currently used decompression mode to the first decompression mode, so that the receiving device can obtain data from a next packet based on the first decompression mode when receiving the next packet sent by the sending device.

Further, the method further includes: when determining that the first check code is one of a plurality of check codes, determining, by the receiving device, that the first compressed data received by the receiving device is the same as the first compressed data sent by the sending device.

Therefore, when determining, according to the first check code, the compression mode used when the sending device compresses the first data, the receiving device may further check whether the first compressed data is correctly transmitted.

In yet another embodiment, after the determining, by the receiving device, that a second decompression mode currently used by the receiving device is different from the first decompression mode corresponding to the first compression mode that is used when the sending device compresses the first data and that is determined by the receiving device, and before the setting, by the receiving device, the decompression mode currently used by the receiving device to the first decompression mode on the basis that the second decompression mode currently used by the receiving device is different from the first decompression mode, the method further includes: discarding, by the receiving device, the first packet.

Therefore, after receiving the first packet, and when determining that the decompression mode currently used by the receiving device is different from the first decompression mode, the receiving device discards the first packet. Therefore, the receiving device is prevented from decompressing the first compressed data by using an incorrect decompression mode, so as to avoid a network exception caused by a leakage of an incorrect data packet into a normal network.

In still another embodiment, before the setting, by the receiving device, the decompression mode currently used by the receiving device to the first decompression mode on the basis that the second decompression mode currently used by the receiving device is different from the first decompression mode, the method further includes: receiving, by the receiving device, a second packet sent by the sending device, where the second packet includes second compressed data and a third check value, the second compressed data is obtained by the sending device by compressing second data based on the first compression mode, the third check value is obtained by the sending device by processing a fourth check value based on the first check algorithm, and the fourth check value is obtained by the sending device by processing the second compressed data based on the second check algorithm; obtaining, by the receiving device, the fourth check value by processing, based on the second check algorithm, the second compressed data included in the second packet; obtaining, by the receiving device, the third check value by processing the obtained fourth check value based on the first check algorithm; determining, by the receiving device on the basis that the obtained third check value is the same as the third check value included in the second packet, that the first check algorithm is a check algorithm used when the sending device generates the second packet; and determining, by the receiving device according to the first check algorithm that is used when the sending device generates the second packet and that is determined by the receiving device and the correspondence between the first check algorithm and the first compression mode, that the first compression mode is a compression mode used when the sending device compresses the second data; and the setting, by the receiving device, the decompression mode currently used by the receiving device to the first decompression mode on the basis that the second decompression mode currently used by the receiving device is different from the first decompression mode includes: setting, by the receiving device, the decompression mode currently used by the receiving device to the first decompression mode on the basis that the second decompression mode currently used by the receiving device is different from the first decompression mode corresponding to the first compression mode that is used when the sending device compresses the first data and that is determined by the receiving device, and that the second decompression mode currently used by the receiving device is different from the first decompression mode corresponding to the first compression mode that is used when the sending device compresses the second data and that is determined by the receiving device.

Therefore, the receiving device continuously determines, twice according to two packets continuously sent by the sending device, that compression modes used by the sending device are the first compression mode. The receiving device switches the currently used decompression mode to the first decompression mode corresponding to the first compression mode, so as to avoid a case in which the compression mode used by the sending device cannot be correctly determined based on a check value caused by a network transmission error, and reduce a probability of false determining and false switching performed by the receiving device.

According to a third aspect, this disclosure provides a data transmission method. The method includes: obtaining, by a sending device, first compressed data by compressing first data based on a first compression mode; obtaining, by the sending device, a second check value by processing the first compressed data based on a second check algorithm; obtaining, by the sending device, a first check value by processing the second check value based on a first check algorithm, where the first check algorithm corresponds to the first compression mode; and sending, by the sending device, a first packet to a receiving device, where the first packet includes the first compressed data and the first check value.

Therefore, the sending device generates a check value based on a check algorithm corresponding to a compression mode, and sends a packet including the check value and compressed data to the receiving device. The receiving device obtains, by processing the check value, a check code used to determine the compression mode. The receiving device determines, according to a correspondence between the check code and the compression mode, the compression mode used when the sending device generates the compressed data. The compression mode is indicated by using the check code, so that overheads are reduced, and system compatibility and extensibility are implemented.

In one embodiment, before obtaining, by the sending device, a first check value by processing the second check value based on a first check algorithm, the method further includes: obtaining, by the sending device, a one-to-one correspondence between a plurality of check algorithms and a plurality of compression modes, where the second check algorithm is different from any one of the plurality of check algorithms; and determining, by the sending device according to the one-to-one correspondence between the plurality of check algorithms and the plurality of compression modes, the first check algorithm corresponding to the first compression mode.

Therefore, the sending device generates different check values based on check algorithms corresponding to different compression modes. The receiving device obtains different check codes by processing the different check values. The receiving device may determine, according to a correspondence between the different check codes and the different compression modes, a compression mode used in compressed data currently sent by the sending device. Therefore, overheads are reduced, and system compatibility and extensibility are implemented.

According to a fourth aspect, this disclosure provides a data transmission apparatus configured to perform the method according to any one of the first aspect or embodiments of the first aspect. In one embodiment, the apparatus includes units configured to perform the method according to any one of the first aspect or the possible implementations of the first aspect.

According to a fifth aspect, this disclosure provides a data transmission apparatus configured to perform the method according to any one of the second aspect or the possible implementations of the second aspect. In one embodiment, the apparatus includes units configured to perform the method according to any one of the second aspect or embodiments of the second aspect.

According to a sixth aspect, this disclosure provides a data transmission apparatus configured to perform the method according to any one of the third aspect or embodiments of the third aspect. In one embodiment, the apparatus includes units configured to perform the method according to any one of the third aspect or embodiments of the third aspect.

According to a seventh aspect, this disclosure provides a data transmission system, and the system includes the apparatus according to the fourth aspect and the apparatus according to the sixth aspect, or the system includes the apparatus according to the fifth aspect and the apparatus according to the sixth aspect.

According to an eighth aspect, this disclosure provides a data transmission device, and the device includes: a receiver, a transmitter, a memory, a processor, and a bus system. The receiver, the transmitter, the memory, and the processor are connected by using the bus system. The memory is configured to store an instruction. The processor is configured to execute the instruction stored in the memory, to control the receiver to receive a signal and control the transmitter to send a signal. In addition, when the processor executes the instruction stored in the memory, the execution enables the processor to perform the method according to any one of the first aspect or embodiments of the first aspect.

According to a ninth aspect, this disclosure provides a data transmission device, and the device includes: a receiver, a transmitter, a memory, a processor, and a bus system. The receiver, the transmitter, the memory, and the processor are connected by using the bus system. The memory is configured to store an instruction. The processor is configured to execute the instruction stored in the memory, to control the receiver to receive a signal and control the transmitter to send a signal. In addition, when the processor executes the instruction stored in the memory, the execution enables the processor to perform the method according to any one of the second aspect or embodiments of the second aspect.

According to a tenth aspect, this disclosure provides a data transmission device, and the device includes: a receiver, a transmitter, a memory, a processor, and a bus system. The receiver, the transmitter, the memory, and the processor are connected by using the bus system. The memory is configured to store an instruction. The processor is configured to execute the instruction stored in the memory, to control the receiver to receive a signal and control the transmitter to send a signal. In addition, when the processor executes the instruction stored in the memory, the execution enables the processor to perform the method according to any one of the third aspect or embodiments of the third aspect.

According to an eleventh aspect, this disclosure provides a data transmission system, and the system includes the device according to the eighth aspect and the device according to the tenth aspect, or the system includes the device according to the ninth aspect and the device according to the tenth aspect.

According to a twelfth aspect, this disclosure provides a computer readable medium, configured to store a computer program, and the computer program includes an instruction used to perform the method according to any one of the first aspect or embodiments of the first aspect.

According to a thirteenth aspect, this disclosure provides a computer readable medium configured to store a computer program, and the computer program includes an instruction used to perform the method according to any one of the second aspect or embodiments of the second aspect.

According to a fourteenth aspect, this disclosure provides a computer readable medium configured to store a computer program, and the computer program includes an instruction used to perform the method according to any one of the third aspect or embodiments of the third aspect.

In some embodiments, the first compression mode includes: an Ethernet frame header compression mode, an IP frame header compression mode, or an Ethernet frame header and IP frame header compression mode.

In some embodiments, the second check value includes a cyclic redundancy check (CRC) value, and the second check algorithm is a CRC algorithm.

According to the data transmission method, apparatus, and system provided in this disclosure, overheads can be reduced, and system compatibility and extensibility are implemented.

BRIEF DESCRIPTION OF DRAWINGS

To describe the technical solutions in the embodiments of the present disclosure more clearly, the following briefly describes the accompanying drawings required for describing the embodiments. Apparently, the accompanying drawings in the following description show merely some embodiments of the present disclosure, and a person of ordinary skill in the art may still derive other drawings from these accompanying drawings without creative efforts.

FIG. 6 is a schematic block diagram of a data transmission apparatus according to still another embodiment;

FIG. 7a and FIG. 7b are schematic block diagrams of a data transmission system according to an embodiment;

FIG. 10 is a schematic block diagram of a data transmission device according to still another embodiment; and FIG. 11a and FIG. 11b are schematic block diagrams of a data transmission system according to an embodiment.

DESCRIPTION OF EMBODIMENTS

Figure 1:
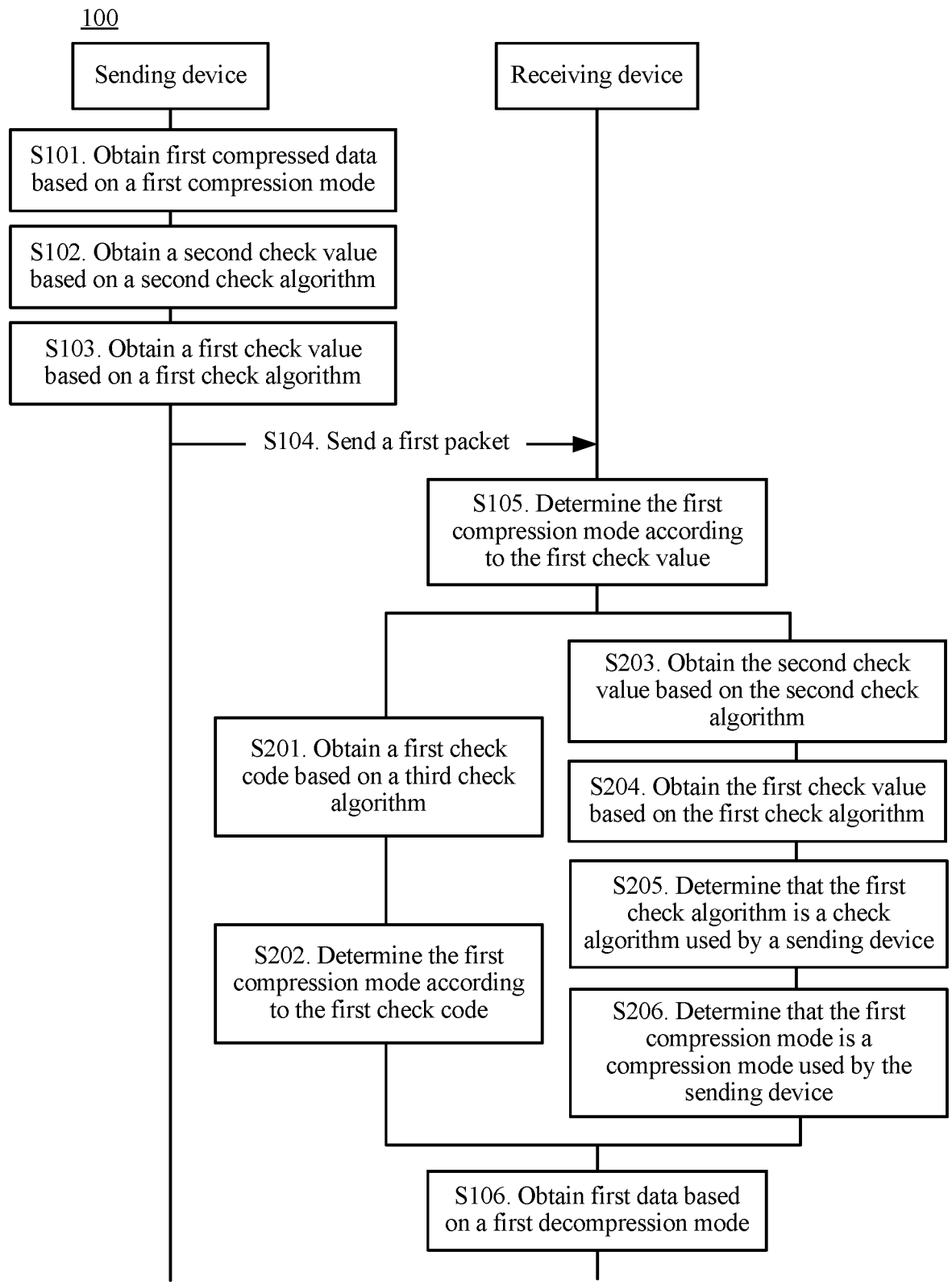
FIG. 1 is a schematic flowchart of a data transmission method according to an embodiment.

The following clearly describes the technical solutions in the embodiments of the disclosure with reference to the accompanying drawings in the embodiments of the present disclosure. Apparently, the described embodiments are a part rather than all of the embodiments.

Terminologies such as "component", "unit", and "system" used in this specification are used to indicate computer-related entities, hardware, firmware, combinations of hardware and software, software, or software being executed. For example, a component may be, but is not limited to, a process that runs on a processor, a processor, an object, an executable file, a thread of execution, a program, and/or a computer. As shown in figures, both a computing device and an application that runs on a computing device may be components. One or more components may reside within a process and/or a thread of execution, and a component may be located on one computer and/or distributed between two or more computers. In addition, these components may be executed from various computer readable media that store various data structures. For example, the components may perform communication according to a signal having one or more data packets (for example, data from one components interacting with another component in a local system, a distributed system, and/or across a network such as the Internet interacting with other systems by using a signal) by using a local and/or remote process.

In addition, aspects or features of the present disclosure may be implemented as a method, an apparatus or a product that uses standard programming and/or engineering technologies. The term "product" used in this disclosure covers a computer program that can be accessed from any computer readable component, carrier or medium. For example, the computer readable medium may include but is not limited to: a magnetic storage component (for example, a hard disk, a floppy disk, or a magnetic tape), an optical disc (for example, a compact disc (CD), or a digital versatile disc (DVD), a smart card and a flash memory component (for example, erasable programmable read only memory (EPROM)), a card, a stick, or a key drive). In addition, various storage media described in this specification may indicate one or more devices and/or other machine-readable media that are configured to store information. The term "machine-readable media" may include but is not limited to a radio channel, and various other media that can store, contain, and/or carry an instruction and/or data.

It should be understood that the embodiments of the present disclosure may be applicable to a point-to-point transmission system of devices supporting a plurality of compression modes. A sending device and a receiving device may negotiate a compression mode, so as to decompress compressed data. For example, both the sending device and the receiving device may be base stations, or base station controllers, or switches. Alternatively, the sending device is a base station, and the receiving device is a radio network controller (RNC). The sending device and the receiving device transmit radio signals by using an air interface. An operator may manage the sending device and the receiving device by using a network management device. When monitoring, by using a traffic monitoring module, that a current network bandwidth is frequently used, the network management device may instruct the sending device to start a compression mode for transmission. In other words, compressing to-be-transmitted data can save bandwidths.

FIG. 1 is a schematic flowchart of a data transmission method 100 described from a perspective of device interaction according to an embodiment. The method 100 may be applied to a point-to-point transmission system supporting one or more compression modes. As shown in FIG. 1, the method 100 includes the following steps.

S101. A sending device obtains first compressed data by compressing first data based on a first compression mode.

In one embodiment, before sending data, the sending device may first determine a compression mode (for example, the first compression mode) used for compressing the first data. Then, the sending device obtains the first compressed data by compressing the first data based on the first compression mode.

In one embodiment, the sending device obtains the first compressed data by compressing the first data based on the first compression mode includes:

A packet received by the sending device by using a receive port may be the first data. For example, the packet may be an Ethernet frame, a Multiprotocol Label Switching (MPLS) packet, an IP packet, or a User Datagram Protocol (UDP) packet.

The sending device obtains the first compressed data by compressing a target field in the first data based on the first compression mode. The target field includes S bits, and a compressed target field is of M bits, where S is greater than M. In one embodiment, the target field may be a field in an Ethernet frame header or in an IP frame header, or one or more fields in a payload of a packet. For example, when the first data is an Ethernet frame, the target field may be an Ethernet type field. For another example, when the first data is an Ethernet frame, the target field may be an Ethernet type field and a source Media Access Control (MAC) protocol address field. In addition, the target field may be a field in a payload of the first data. For example, when the first data is an Ethernet frame, and the Ethernet frame includes an IP header, the target field may be a protocol field. For another example, when a packet carrying the first data is an IP packet, and the IP packet includes a UDP header, the target field may be a source port field and a destination port field.

In this embodiment, the sending device obtains a compressed field by compressing the target field. That is, the first data includes the target field and data that does not need to be compressed. The first compressed data includes the compressed field and the data that is not compressed. The sending device sends the first compressed data to a receiving device. The receiving device generates the first data by decompressing the first compressed data according to a decompression mode corresponding to the first compression mode. The first data includes the target field.

In this embodiment, the sending device and the receiving device may establish a one-to-one correspondence between a target field and a compressed field by using a compression mapping relationship table agreed in advance. The sending device determines, according to the compression mapping relationship table, the compressed field corresponding to the target field. The sending device generates a first packet (for detailed description of the first packet, refer to S104) including the compressed field, so that data compression is implemented. The receiving device decompresses the compressed field according to the compression mapping relationship table, and generates a value in the original target field, so that decompression of the compressed data is implemented. For example, the target field may be an Ethernet type field, and when a value of the target field is "0800", the corresponding compressed field is "0"; or when a value of the target field is "8847", the corresponding compressed field is "1". In other words, the sending device and the receiving device may prestore the compression mapping relationship table. In the compression mapping relationship table, different values of the target field correspond to different compressed fields. The sending device and the receiving device perform data compression and data decompression according to the compression mapping relationship table.

Alternatively, the sending device updates the compression mapping relationship table periodically or on demand based on a value in a current compressed target field, and sends an updated compression mapping relationship table to the receiving device. The receiving device decompresses a compressed field in received compressed data based on the updated compression mapping relationship table. Further, because the target field may be an Ethernet frame header, an IP frame header, or even a physical layer (PHY) frame header, the sending device may compress one or more of the frame headers. However, the receiving device does not know which frame headers are compressed by the sending device, and cannot perform correct parsing when receiving the compressed data. The sending device may send indication information to indicate a decompression mode based on which the receiving device decompresses the compressed data.

That is, the sending device may compress data based on different compression modes. For example, the first compression mode may be: performing compression only on an Ethernet frame header, or performing compression only on an IP frame header, or performing compression on both an Ethernet frame header and an IP frame header. In this embodiment, when the sending device compresses the first data based on the first compression mode, the sending device generates a first check value based on a first check algorithm corresponding to the first compression mode. The receiving device determines, according to the first check value, a decompression mode based on which data is to be decompressed. That is, one compression mode corresponds to one compression mapping relationship table. For example, the compression mapping relationship table may be a one-to-one correspondence between an IP frame header and a compressed field, or may be a one-to-one correspondence between an Ethernet frame header and a compressed field. When determining a compression mode used by the sending device, the receiving device determines a compression mapping relationship table based on which received data sent by the sending device is compressed, so as to determine the compression mapping relationship table based on which decompression is to be performed.

S102. The sending device obtains a second check value by processing the first compressed data based on a second check algorithm.

In one embodiment, after obtaining the first compressed data by compressing the first data, the sending device obtains the second check value by processing the first compressed data based on the second check algorithm.

As an example instead of a limitation, the second check value is a CRC value, and the second check algorithm is a CRC algorithm.

That is, the sending device obtains the CRC value by processing the first compressed data based on the CRC algorithm.

In this embodiment, the sending device obtains the CRC value by processing the to-be-sent compressed data based on the second check algorithm. Specifically, the second check algorithm may be understood as: the sending device shifts the compressed data leftwards by m bits based on a highest power m of a generator polynomial, and fills the empty m bits with "0". Then, the sending device obtains the CRC value by performing a CRC operation on the first compressed data based on the generator polynomial, and the CRC value has m bits. After obtaining the CRC value by performing processing based on the second check algorithm, the sending device does not encapsulate the CRC value and the first compressed data into a packet or send the packet to the receiving device, but waits for the sending device to process the CRC value in S103.

For example, the first compressed data is a binary number "1010". The sending device stores a computer program used to execute the second check algorithm. The second check algorithm includes a generator polynomial $G(x)=x^3+x+1$. The generator polynomial $G(x)$ may be represented as a binary number "1011". A highest power m of the generator polynomial $G(x)$ is equal to 3. The first compressed data is shifted leftwards by three bits, to obtain "1010 000". Then, a CRC operation is performed on "1010 000" by using the generator polynomial $G(x)=x^3+x+1$, and a remainder "011" may be obtained, that is, the CRC value.

It should be understood that the foregoing illustrated first compressed data and CRC value are merely described as examples, and should not be construed as any limitation on the present disclosure. The present disclosure is not limited thereto. Actually transmitted compressed data may be of more bits, and a CRC value corresponding to the compressed data may be of 16 bits, 32 bits, or more bits.

S103. The sending device obtains a first check value by processing the second check value based on a first check algorithm.

In one embodiment, the sending device determines a corresponding check algorithm according to the compression mode used when the first data is being compressed, to process the second check value and obtain the first check value, and further generate a corresponding packet. A check algorithm corresponding to the first compression mode is the first check algorithm. In this embodiment of the present disclosure, the sending device may obtain the first check value by processing, based on the first check algorithm, the second check value generated in S102. As an example instead of a limitation, an algorithm used to generate the first check value includes: performing a negation operation on one or more bits in the second check value. For example, the sending device performs a negation operation on one or more bits in the CRC value based on the CRC value generated in S102, so that the generated first check value is different from the CRC value. For example, the CRC value generated in S102 (that is, an example of the second check value) is "011". Assuming that the first check algorithm is to perform a negation operation on a least significant bit (LSB) of the second check value, the first check value may be "010". Alternatively, assuming that the first check algorithm is to perform a negation operation on a second bit of the second check value, the first check value may be "001".

It should be understood that specific content of the foregoing illustrated first check algorithm is merely described as an example, and should not be construed as any limitation on the present disclosure. For example, one or more bits in the second check value may be processed, so that the generated first check value is different from the second check value.

In one embodiment, before the sending device obtains the first check value by processing the second check value based on the first check algorithm, the method further includes:

the sending device obtains a one-to-one correspondence between a plurality of check algorithms and a plurality of compression modes; and the sending device determines, according to the one-to-one correspondence between the plurality of check algorithms and the plurality of compression modes, the first check algorithm corresponding to the first compression mode.

In one embodiment, before performing S101, the sending device may obtain the one-to-one correspondence between the plurality of check algorithms and the plurality of compression modes from a memory of the sending device. The sending device may prestore a plurality of computer programs according to the plurality of compression modes supported by the sending device. The plurality of computer programs are respectively used to implement the plurality of check algorithms corresponding to the plurality of compression modes. The plurality of check algorithms include the first check algorithm, and the plurality of check algorithms do not include the second check algorithm.

As an example instead of a limitation, the plurality of compression modes may include: an Ethernet frame header compression mode, an IP frame header compression mode, and an Ethernet frame header and IP frame header compression mode. Alternatively, the first compression mode may be: an Ethernet frame header compression mode, an IP frame header compression mode, or an Ethernet frame header and IP frame header payload compression mode.

For example, when the first compression mode is the Ethernet frame header compression mode, the corresponding second check value is a hexadecimal number "7FFF". The sending device obtains the first check value by processing the second check value based on the first check algorithm corresponding to the first compression mode. The first check value is a hexadecimal number "1000". When the first compression mode is the IP frame header compression mode, the corresponding second check value is a hexadecimal number "1FFF". The sending device obtains the first check value by processing the second check value based on the first check algorithm. The first check value is a hexadecimal number "3800". When the first compression mode is the Ethernet frame header and IP frame header compression mode, the corresponding second check value is a hexadecimal number "3FFF". The sending device obtains the first check value by processing the second check value based on the first check algorithm. The first check value is a hexadecimal number "E001".

It should be understood that the foregoing illustrated first compression mode and first check value are merely described as examples, and should not be construed as any limitation on the present disclosure. For example, the first check value may be of 16 bits, 32 bits, or more bits. For another example, the first check value may be a hexadecimal number or a binary number. This is not particularly limited in the present disclosure.

Before compressing data, the sending device may first determine the plurality of compression modes supported by the sending device, and obtain the one-to-one correspondence between the plurality of check algorithms and the plurality of compression modes according to the plurality of compression modes. The one-to-one correspondence between the plurality of check algorithms and the plurality of compression modes is referred to as a first mapping relationship in the following. Table 1 shows an example of the first mapping relationship.

| Check algorithm | Compression mode |
| --- | --- |
| Check algorithm 1 | Compression mode 1 |
| Check algorithm 2 | Compression mode 2 |
| Check algorithm 3 | Compression mode 3 |

The sending device obtains, according to the first mapping relationship, the first check algorithm corresponding to the first compression mode, and further obtains the first check value by processing the second check value based on the first check algorithm.

It should be understood that the sending device may store a correspondence between one check algorithm and one compression mode, or a correspondence between a plurality of check algorithms and a plurality of compression modes. This is not particularly limited in the present disclosure.

It should be further understood that the specific method illustrated herein for determining a compression mode by the sending device is merely described as an example, and should not be construed as any limitation on the present disclosure. The method for determining a currently used compression mode by the sending device is similar to that in the prior art. For brevity, details are not described herein.

It should be noted that the foregoing illustrated second check algorithm and first check algorithm are two different algorithms. Alternatively, the second check algorithm is different from any one of the plurality of check algorithms. For the second check algorithm, refer to the CRC algorithm in the prior art.

A difference between the second check algorithm and the first check algorithm lies in that the first check algorithm corresponds to a compression mode used by the sending device. For different compression modes, the sending device generates the first check value by using different check algorithms, and further generates packets.

S104. The sending device sends a first packet to a receiving device, where the first packet includes the first compressed data and the first check value.

In one embodiment, after the sending device obtains the first check value by processing the second check value based on the first check algorithm, the sending device processes the obtained first check value and the first compressed data to generate the first packet. The first packet includes the first compressed data and the first check value. For example, the foregoing illustrated first packet may include a binary number "1010 010", where "1010" is obtained by the sending device by performing compression based on the first compression mode, and "010" is obtained by the sending device by performing processing based on the second check algorithm and the first check algorithm corresponding to the first compression mode. Alternatively, the first packet may include a binary number "1010 001", where "1010" is generated by the sending device by performing compression based on the first compression mode, and "001" is obtained by the sending device by performing processing based on the second check algorithm and the first check algorithm corresponding to the first compression mode.

S105. The receiving device determines, according to the first packet, that the first compression mode is a compression mode used when the sending device compresses the first data.

In one embodiment, after receiving the first packet sent by the sending device, the receiving device needs to first determine the compression mode used when the sending device compresses the first data. In a specific implementation, the receiving device may obtain a first check code by processing the first packet based on a third check algorithm, and determine, according to a correspondence between a check code and a compression mode, the first compression mode corresponding to the first check code. In another specific implementation, after obtaining the second check value by processing the first compressed data based on the second check algorithm, the receiving device may obtain a check value the same as the first check value by processing the second check value based on the first check algorithm, and further determine, according to a correspondence between a check algorithm and a compression mode, the first compression mode corresponding to the first check algorithm. The following separately describes specific processes of the implementation (that is, method 1) and the another implementation (that is, method 2) in detail.

S106. The receiving device obtains the first data by decompressing, based on a first decompression mode, the first compressed data included in the first packet.

In one embodiment, after determining, according to the first check value in the received first packet, the compression mode used by the sending device, the receiving device may set a decompression mode of the receiving device to the first decompression mode corresponding to the first compression mode. The receiving device obtains the first data by decompressing, based on the first decompression mode, the first compressed data included in the first packet.

In one embodiment, S106 may also be as follows: The receiving device decompresses, based on the first decompression mode, compressed data included in another packet. The other packet is a packet received by the receiving device from the sending device. A time point at which the sending device sends the other packet is later than a time point at which the sending device sends the first packet.

Therefore, according to the data transmission method in this embodiment, the sending device generates a check value based on a check algorithm corresponding to a compression mode. The receiving device processes a packet including compressed data and the check value, to obtain a check code or a check algorithm that is used to determine the compression mode. The receiving device may determine, according to a correspondence between a check code and a compression mode or a correspondence between a check algorithm and a compression mode, the compression mode used in the compressed data sent by the sending device. Compared with the prior art in which a compression mode is indicated by using an extra overhead byte in a packet header, the indication information is carried by using the check value in the present disclosure, so that overheads are reduced. In addition, in the prior art, sufficient overhead bytes need to be reserved for extra overhead bytes in the packet header during system planning. If sufficient overhead bytes are not reserved during system planning, the compression mode cannot be indicated by using this method. In the present disclosure, no overhead byte needs to be reserved during system planning, so that system compatibility and extensibility are implemented.

With reference to FIG. 1, the following describes in detail a method (the method 1 or the method 2) for determining the first compression mode by the receiving device according to the first check value.

Method 1:

S201. The receiving device obtains a first check code by processing the first packet based on a third check algorithm.

S202. The receiving device determines, according to the obtained first check code and a correspondence between the first check code and the first compression mode, that the first compression mode is the compression mode used when the sending device compresses the first data.

In one embodiment, the receiving device stores a computer program used to execute the third check algorithm. The sending device stores a computer program used to execute the second check algorithm. The third check algorithm and the second check algorithm include a same generator polynomial. The sending device obtains the second check value by processing the first compressed data based on the second check algorithm, then obtains the first check value by processing the second check value based on the first check algorithm, and further generates the first packet. The first packet includes the first compressed data and the first check value. The receiving device may obtain the first check code by processing the received first packet based on the third check algorithm. Specifically, the third check algorithm may be understood as: the receiving device performs a CRC operation on the received first packet based on the generator polynomial, and an obtained remainder is the first check code.

For example, in S104, the sending device may obtain the first packet after performing processing based on the first compression mode, the second check algorithm, and the first check algorithm. For example, the first packet includes the binary number "1010 010", where "1010" is obtained by the sending device by performing compression based on the first compression mode, and "010" is obtained by the sending device by performing processing based on the second check algorithm and the first check algorithm corresponding to the first compression mode. The third check algorithm and the second check algorithm include the same generator polynomial $G(x)=x^3+x+1$. The generator polynomial $G(x)$ may be represented as the binary number "1011". The receiving device performs the CRC operation on the first packet based on the generator polynomial, and a remainder "001" may be obtained. Alternatively, it is assumed that the first packet includes the binary number "1010 001", where "1010" is obtained by the sending device by performing compression based on the first compression mode, and "001" is obtained by the sending device by performing processing based on the second check algorithm and the first check algorithm corresponding to the first compression mode. The receiving device performs the CRC operation on the first packet based on the generator polynomial, and a remainder "010" may be obtained. It may be learned that, after the sending device processes the second check value by using different check algorithms, when the receiving device performs the CRC operation based on the same generator polynomial, different results are also obtained.

After obtaining the first check code based on the third check algorithm, the receiving device may determine, according to a correspondence that is between a check code and a compression mode and that is prestored in the receiving device, that the first compression mode corresponding to the first check code is the compression mode used when the sending device compresses the first data.

In one embodiment, the receiving device determines, according to the obtained first check code and a correspondence between the first check code and the first compression mode, that the first compression mode is the compression mode used when the sending device compresses the first data includes:

the receiving device obtains a one-to-one correspondence between a plurality of check codes and a plurality of compression modes, where the plurality of check codes include the first check code; and the receiving device determines, according to the one-to-one correspondence between the plurality of check codes and the plurality of compression modes, that the first compression mode corresponding to the first check code is the compression mode used when the sending device compresses the first data.

In one embodiment, the receiving device may obtain the one-to-one correspondence between the plurality of check codes and the plurality of compression modes from a memory in advance. The one-to-one correspondence between the plurality of check codes and the plurality of compression modes is referred to as a second mapping relationship in the following. In this embodiment, the receiving device may determine, according to the plurality of compression modes supported by the sending device, a plurality of decompression modes supported by the receiving device, and the first mapping relationship obtained by the sending device in S103, the plurality of check codes corresponding to the plurality of check algorithms, and further determine the second mapping relationship of the compression modes. Alternatively, each compression mode corresponds to one check code, and the check codes are different from each other. The receiving device may obtain the first check code by processing the received first packet based on the prestored computer program used to implement the third check algorithm. The receiving device determines, according to the one-to-one correspondence between the plurality of check codes and the plurality of compression modes, the first compression mode corresponding to the first check code, so as to determine that the sending device compresses the first packet based on the first compression mode.

For example, the first packet illustrated in S201 may include the binary number "1010 010", and the corresponding check code is "001"; or the first packet may include the binary number "1010 001", and the corresponding check code is "010". That is, two different check codes correspond to two different compression modes.

It should be noted that the plurality of check codes prestored in the receiving device are obtained by the receiving device by processing, based on the third check algorithm, check values obtained after the sending device performs processing based on the second check algorithm and the plurality of check algorithms corresponding to the plurality of compression modes.

Further, the receiving device may pre-stipulate: when the first check code obtained by the receiving device based on the third check algorithm is any one of the plurality of check codes, it may be determined that no error occurs in a transmission process of compressed data included in a corresponding packet. That is, when determining that the first check code is one of the plurality of check codes, the receiving device may determine that the first compressed data in the first packet received by the receiving device is the same as the first compressed data in the first packet sent by the sending device.

In other words, the sending device and the receiving device may agree in advance a check code used to indicate a compression mode. When a check code obtained by the receiving device by processing a packet based on the third check algorithm is the check code agreed in advance, it is considered that no error occurs in a data transmission process. When a check code obtained by the receiving device by processing a packet based on the third check algorithm is not the check code agreed in advance, it is considered that an error occurs in a data transmission process.

It should be noted that the receiving device obtains the first check code by processing the received first packet based on the third check algorithm. That is, a correspondence exists between the first check algorithm used by the sending device and the first check code prestored in the receiving device. In other words, when the sending device generates a plurality of pieces of compressed data based on the first compression mode and sends the plurality of pieces of compressed data to the receiving device, for each piece of compressed data, a corresponding packet may be generated based on the first check algorithm. Each packet includes different compressed data, but a same algorithm is used to generate the packet. Therefore, results obtained by the receiving device based on the third check algorithm are a same check code, that is, the first check code. It should be understood that the receiving device may store a correspondence between one check code and one compression mode, or a correspondence between a plurality of check codes and a plurality of compression modes. This is not particularly limited in the present disclosure.

It should be further understood that for specific execution methods of the second check algorithm and the third check algorithm, refer to the CRC algorithm in the prior art. Different from the prior art, in the present disclosure, after a check value is obtained by further processing, based on a check algorithm corresponding to a compression mode, a CRC value obtained based on the second check algorithm, a packet including compressed data and the check value is sent to the receiving device. The receiving device may obtain a check code by processing the packet based on the third check algorithm, and further determine, according to a correspondence between a check code and a compression mode, the compression mode used by the sending device.

Therefore, according to the method in this embodiment of the present disclosure, the sending device generates a check value based on a check algorithm corresponding to a compression mode. The receiving device obtains, by processing the check value, a check code used to determine the compression mode. The receiving device may determine, according to a correspondence between the check code and the compression mode, the compression mode used when the sending device compresses data. Therefore, overheads are reduced, and system compatibility and extensibility are implemented. In addition, whether an error occurs during data transmission can be determined by using the check code, so that transmission accuracy is ensured.

Method 2:

S203. The receiving device obtains the second check value by processing, based on the second check algorithm, the first compressed data included in the first packet.

S204. The receiving device obtains the first check value by processing the obtained second check value based on the first check algorithm.

S205. The receiving device determines, on the basis that the obtained first check value is the same as the first check value included in the first packet, that the first check algorithm is a check algorithm used when the sending device generates the first packet.

S206. The receiving device determines, according to the first check algorithm that is used when the sending device generates the first packet and that is determined by the receiving device and a correspondence between the first check algorithm and the first compression mode, that the first compression mode is the compression mode used when the sending device compresses the first data.

In one embodiment, after receiving the first packet, the receiving device first obtains the first compressed data included in the first packet. A specific method for obtaining compressed data from a packet by the receiving device is similar to a specific method for obtaining a field in a packet header from a packet by the receiving device in the prior art. For brevity, details are not described herein.

The receiving device may obtain the second check value by processing the obtained first compressed data based on a prestored computer program used to implement the second check algorithm. A method for obtaining the second check value by the receiving device by processing the first compressed data based on the second check algorithm is the same as a method for obtaining the second check value by the sending device by processing the first compressed data based on the second check algorithm. The specific method for obtaining the second check value by the sending device by processing the first compressed data based on the second check algorithm has been described in detail above. For brevity, details are not described herein again.

After obtaining the second check value, the receiving device obtains the first check value by processing the second check value based on the first check algorithm. It should be noted herein that when performing processing based on the first check algorithm, the receiving device does not know that the check algorithm used by the receiving device is a check algorithm that is the same as the first check algorithm used by the sending device. The receiving device may prestore a computer program used to execute the first check algorithm. When the check value obtained by the receiving device by processing the second check value based on the first check algorithm is the same as the first check value in the first packet sent by the sending device, the receiving device may determine that the first check algorithm is the first check algorithm used by the sending device.

After determining the first check algorithm used by the sending device, the receiving device may determine, according to a correspondence that is between a check algorithm and a compression mode and that is prestored in the receiving device, that the first compression mode corresponding to the first check algorithm is the compression mode used when the sending device compresses the first data.

It should be noted that in this embodiment, because the first packet includes the first compressed data and the first check value, the receiving device may also determine, according to whether a packet obtained after the first compressed data is processed is the same as the received first packet, whether the first check algorithm is the check algorithm used when the sending device generates the first packet. This is not particularly limited in the present disclosure.

In one embodiment, that the receiving device obtains the first check value by processing the obtained second check value based on the first check algorithm includes:

the receiving device obtains a plurality of check values by separately processing the second check value based on a plurality of check algorithms, where the plurality of check values include the first check value, and the plurality of check values correspond one-to-one to the plurality of check algorithms.

In one embodiment, the receiving device may obtain a one-to-one correspondence between a plurality of check algorithms and a plurality of compression modes from a memory in advance. The one-to-one correspondence between the plurality of check algorithms and the plurality of compression modes is referred to as a third mapping relationship in the following. In this embodiment of the present disclosure, the receiving device may determine the third mapping relationship according to the plurality of compression modes supported by the sending device and a plurality of decompression modes supported by the receiving device. The third mapping relationship is the same as the first mapping relationship prestored in the sending device.

It should be understood that the third mapping relationship may include a correspondence between one check algorithm and one compression mode, or a correspondence between a plurality of check algorithms and a plurality of compression modes. This is not particularly limited in the present disclosure.

In this embodiment, the receiving device may obtain a plurality of check values by separately processing the second check value based on the plurality of check algorithms in the third mapping relationship. The receiving device searches the plurality of obtained check values for a check value the same as the first check value included in the first data packet, and determines that a check algorithm used to generate the check value is the first check algorithm.

Further, the receiving device may preset: when the receiving device separately executes a plurality of prestored computer programs used to implement the plurality of check algorithms and can determine the check algorithm used to generate the first check value, it may be determined that no error occurs in a transmission process of compressed data included in a corresponding packet. When the receiving device separately executes a plurality of prestored computer programs used to implement the plurality of check algorithms and cannot determine the check algorithm used to generate the first check value, it may be determined that an error occurs in a transmission process of compressed data included in a corresponding packet. That is, when the plurality of computer programs that are used to implement the plurality of check algorithms and that are prestored in the receiving device include the computer program used to implement the first check algorithm, it may be determined that the first compressed data in the first packet received by the receiving device is the same as the first compressed data in the first packet sent by the sending device.

Therefore, according to the data transmission method in this embodiment, the sending device generates a check value based on a check algorithm corresponding to a compression mode, and sends a packet including the check value and compressed data to the receiving device. The receiving device processes the compressed data in the packet to determine a check algorithm the same as that used by the sending device. The receiving device determines, according to a correspondence between the check algorithm and the compression mode, the compression mode used when the sending device generates the compressed data. The compression mode is indicated by using the check algorithm, so that overheads are reduced, and system compatibility and extensibility are implemented.

It should be understood that specific content of the foregoing illustrated first compressed data and first packet is merely described as examples, and should not be construed as any limitation on the present disclosure. The present disclosure is not limited thereto. Actually transmitted data may be of more bits, and a used CRC value may be of 16 bits, 32 bits, or more bits.

It should be further understood that the foregoing illustrated method for determining the compression mode by using the check value in this embodiment of the present disclosure is merely described as an example, and should not be construed as any limitation on the present disclosure. The present disclosure is not limited thereto. The present disclosure is also applicable to a transmission system that has a plurality of operation modes (for example, a non-compression mode) and that requires devices at two ends to switch operation modes by means of negotiation.

Figure 2:
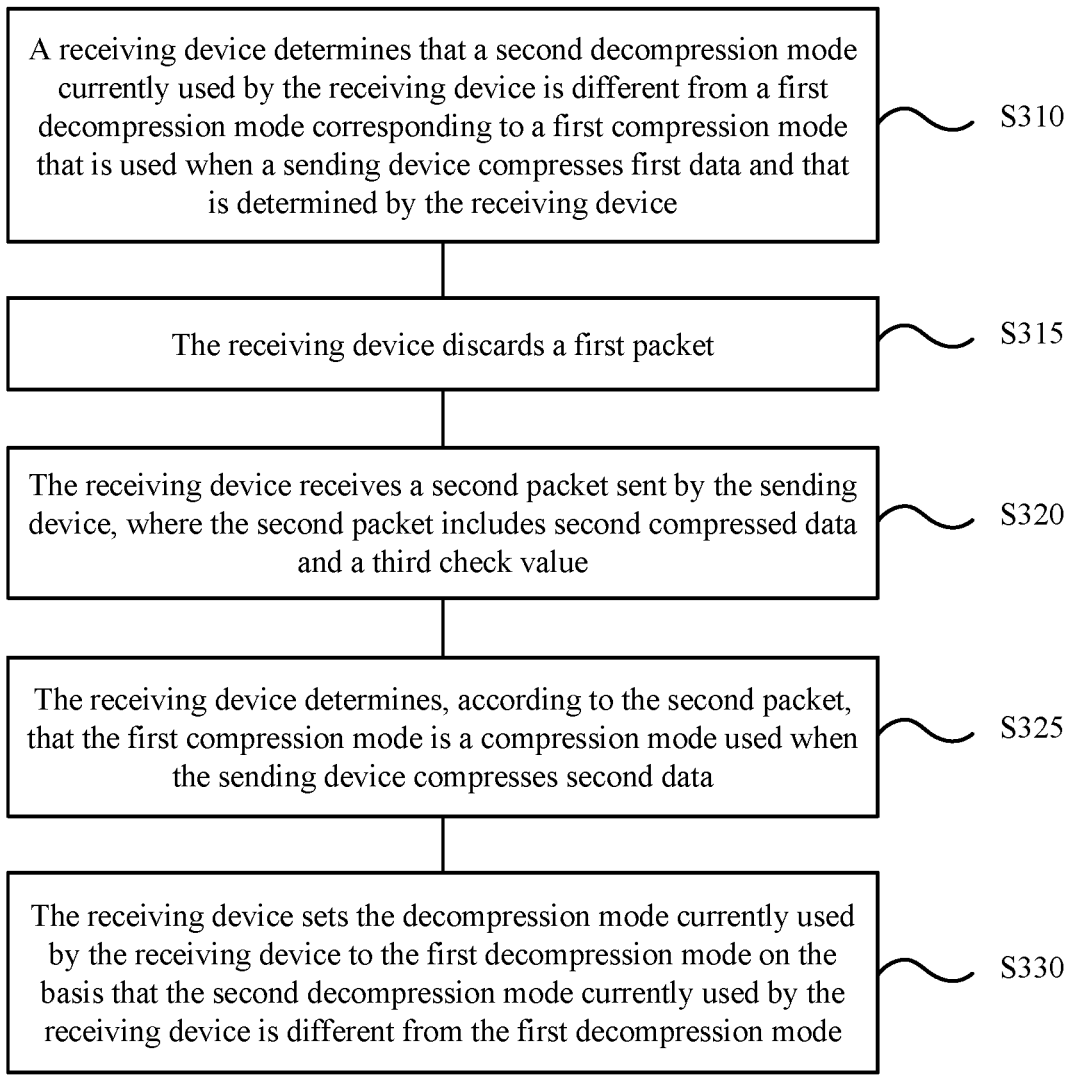
FIG. 2 is another schematic flowchart of a data transmission method according to an embodiment.
Figure 3:
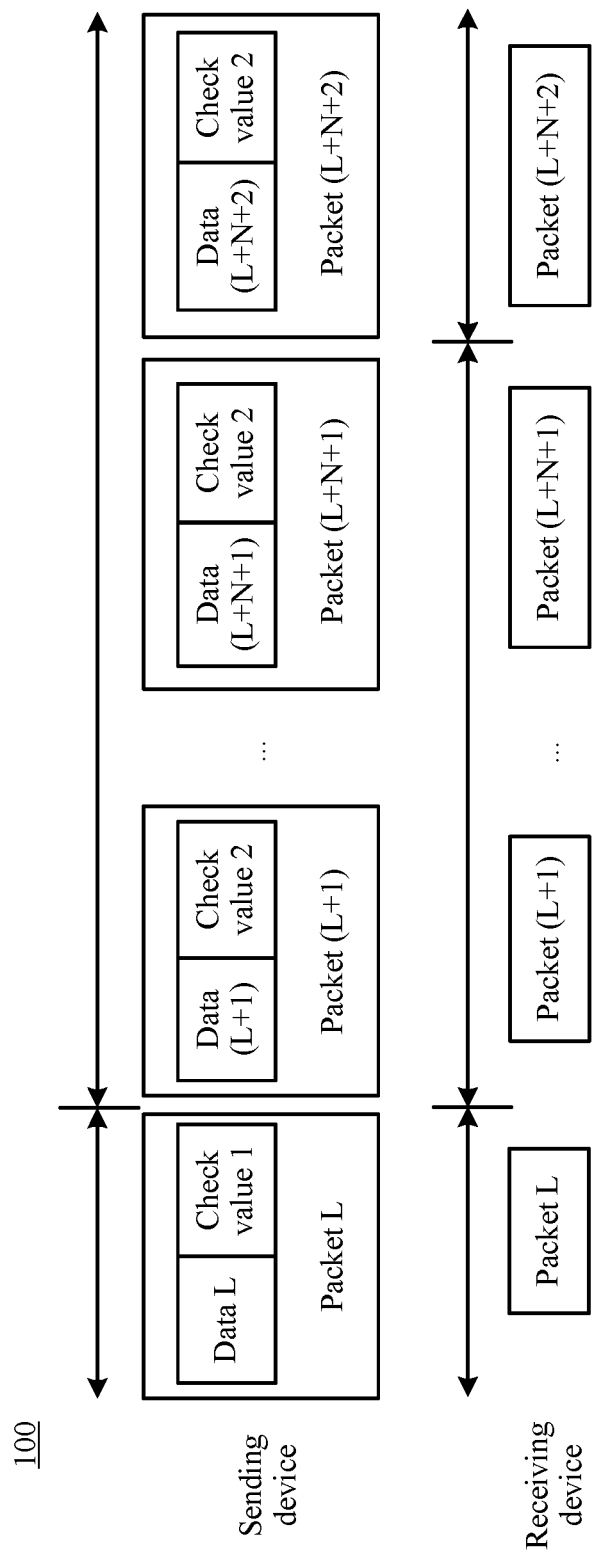
FIG. 3 is another schematic diagram of a data transmission method according to an embodiment.

With reference to FIG. 1, the data transmission method 100 in this embodiment is described in detail above. With reference to FIG. 2 and FIG. 3, a process of switching a compression mode by the receiving device is described in detail below.

In this embodiment, to ensure that data is correctly parsed, a compression mode used by the receiving device needs to be the same as a compression mode used by the sending device. However, when the compression mode used by the sending device changes, the receiving device can determine a compression mode according to a data packet only when receiving the data packet first sent by the sending device after the compression mode is switched.

FIG. 2 is another schematic flowchart of a data transmission method 100 according to an embodiment.

In one embodiment, as shown in FIG. 2, after the receiving device determines that the first compression mode is the compression mode used when the sending device compresses the first data, and before the receiving device obtains the first data by decompressing, based on the first decompression mode, the first compressed data included in the first packet in S106, the method 100 further includes the following steps.

S310. The receiving device determines that a second decompression mode currently used by the receiving device is different from the first decompression mode corresponding to the first compression mode that is used when the sending device compresses the first data and that is determined by the receiving device.

S330. The receiving device sets the decompression mode currently used by the receiving device to the first decompression mode on the basis that the second decompression mode currently used by the receiving device is different from the first decompression mode.

The first decompression mode is used to replace the second decompression mode. In one embodiment, the receiving device may determine, based on the method 1 or the method 2, the compression mode used by the sending device for compressing the first data. After determining the compression mode used by the sending device, the receiving device determines, according to the currently used decompression mode, whether the received first packet can be correctly parsed.

In this embodiment, an identifier of a check algorithm or check code that is used to indicate the current decompression mode may be prestored in a register or other storage space of the receiving device.

In one embodiment, the receiving device may determine the currently used decompression mode (which is referred to as the second decompression mode for ease of distinguishing and description) according to the prestored check code. The receiving device determines, according to a check code (that is, the first check code obtained by using the method 1) corresponding to the received first packet, the first compression mode used when the sending device compresses the first data. The receiving device may directly compare the first check code obtained based on the first packet with the check code prestored in the register or the other storage space. When the two check codes are the same, the receiving device determines that the currently used decompression mode corresponds to the compression mode used by the sending device, that is, the second decompression mode corresponds to the first compression mode. The second decompression mode used by the receiving device is a decompression mode corresponding to the first compression mode, and the receiving device may obtain the first data by decompressing the first compressed data directly based on the currently used second decompression mode. On the contrary, when the two check codes are different, the receiving device determines that the currently used decompression mode does not correspond to the compression mode used by the sending device, and therefore, the receiving device cannot correctly decompress the first data in the first compressed data.

Alternatively, the receiving device may determine the currently used decompression mode (that is, the second decompression mode) according to the prestored identifier of the check algorithm. The receiving device determines, according to a check algorithm (that is, the first check algorithm determined by using the method 2) corresponding to the received first packet, the first compression mode used when the sending device compresses the first data. The receiving device may directly compare an identifier of the first check algorithm determined based on the first packet with the identifier that is of the check algorithm and that is prestored in the register or the other storage space. When the two identifiers are the same, the receiving device determines that the currently used decompression mode corresponds to the compression mode used by the sending device, that is, the second decompression mode corresponds to the first compression mode. The second decompression mode used by the receiving device is a decompression mode corresponding to the first compression mode, and the receiving device may obtain the first data by decompressing the first compressed data directly based on the currently used second decompression mode. On the contrary, when the two identifiers are different, the receiving device determines that the currently used decompression mode does not correspond to the compression mode used by the sending device, and therefore, the receiving device cannot correctly decompress the first data in the first compressed data.

It should be understood that in this embodiment of the present disclosure, a compression mode corresponds to a decompression mode, or compression and decompression are reversible. A correspondence between a compression mode and a check code or a correspondence between a compression mode and a check algorithm may be understood as a correspondence between a decompression mode and a check code or a correspondence between a decompression mode and a check algorithm. That is, when the correspondence between the compression mode and the check code is known, the correspondence between the decompression mode and the check code can be learned; or when the correspondence between the compression mode and the check algorithm is known, the correspondence between the decompression mode and the check algorithm can be learned.

It should be further understood that the first compression mode and the second decompression mode illustrated herein are merely described as examples, and should not be construed as any limitation on the present disclosure. For example, the sending device may compress the first packet by using a third compression mode, and the decompression mode currently used by the receiving device may be the first decompression mode. This is not particularly limited in the present disclosure.

Further, after the receiving device determines that the second decompression mode currently used by the receiving device is different from the first decompression mode corresponding to the first compression mode that is used when the sending device compresses the first data and that is determined by the receiving device in S310, the method 100 further includes the following step:

S315. The receiving device discards the first packet.

In one embodiment, when the receiving device determines that the currently used decompression mode is different from the first decompression mode corresponding to the compression mode used when the sending device compresses the first data, or when the receiving device determines that the currently used decompression mode does not correspond to the compression mode used when the sending device compresses the first data, the receiving device determines that the first data in the first compressed data cannot be correctly decompressed. To avoid a network exception caused by a leakage of an incorrect data packet into a normal network, the receiving device discards the currently received first packet.

In one embodiment, before the receiving device sets the decompression mode currently used by the receiving device to the first decompression mode on the basis that the second decompression mode currently used by the receiving device is different from the first decompression mode in S330, the method 100 further includes the following steps:

S320. The receiving device receives a second packet sent by the sending device, where the second packet includes second compressed data and a third check value, the second compressed data is obtained by the sending device by compressing second data based on the first compression mode, the third check value is obtained by the sending device by processing a fourth check value based on the first check algorithm, and the fourth check value is obtained by the sending device by processing the second compressed data based on the second check algorithm.

S325. The receiving device determines, according to the second packet, that the first compression mode is a compression mode used when the sending device compresses the second data.

In one embodiment, because an error may occur in a transmission process, to avoid false switching, after determining that the currently used second decompression mode is different from the first decompression mode corresponding to the compression mode used when the sending device compresses the first data, the receiving device may not set the current decompression mode to the first decompression mode immediately. That is, when receiving a packet sent by the sending device and determining the first decompression mode, the receiving device does not switch the second decompression mode to the first decompression mode immediately. After determining, twice or a plurality of times according to two or more packets continuously sent by the sending device, that compression modes used by the sending device are the first compression mode, the receiving device may set the currently used decompression mode to the first decompression mode.

In this embodiment, the second packet may be understood as a first packet sent to the receiving device after the sending device compresses the second data and performs processing based on the second check algorithm and the first check algorithm after the sending device switches from another compression mode to the first compression mode. The first packet may be understood as a packet sent by the sending device after the second packet, or the first packet may be understood as a packet received by the receiving device after the second packet. The receiving device may determine, once based on the second packet, the first compression mode used by the sending device, and may determine, once again based on the first packet, the first compression mode used by the sending device. That is, the receiving device may record, by using a counter, determining performed each time. When recording is performed twice or more times, it may be determined that the compression mode currently used by the sending device is the first compression mode. The receiving device may set the currently used decompression mode to the first decompression mode.

It should be noted that when the receiving device continuously determines, a plurality of times based on a same check code or a same check algorithm, the first compression mode used by the sending device, counting may be continuously performed. When the receiving device determines, based on different check codes or different check algorithms, that the compression mode used by the sending device is not always the first compression mode, counting needs to be performed again and recording should not be continuously performed when a check code or a check algorithm changes, so as to avoid false determining and false switching.

It should be understood that the foregoing illustrated first packet and second packet are merely described as examples. "First" and "second" are merely used to distinguish two sending actions of the sending device or two receiving actions of the receiving device, and should not be construed as any limitation on the present disclosure.

It should be further understood that the first packet and the second packet are merely described as examples. The receiving device may further switch the currently used decompression mode based on more received packets and determining performed more times.

In this embodiment, a specific method for determining, by the receiving device according to the second packet, the compression mode used when the sending device compresses the second data in S325 may be similar to the method 1 and the method 2.

In one embodiment, the receiving device determines, according to the second packet, that the first compression mode is a compression mode used when the sending device compresses the second data in S325 includes:

the receiving device obtains the first check code by processing the second packet based on the third check algorithm; and the receiving device determines, according to the obtained first check code and the correspondence between the first check code and the first compression mode, that the first compression mode is the compression mode used when the sending device compresses the second data.

In one embodiment, the receiving device determines, according to the second packet, that the first compression mode is a compression mode used when the sending device compresses the second data in S325 includes:

the receiving device receives the second packet sent by the sending device, where the second packet includes the second compressed data and the third check value, the second compressed data is obtained by the sending device by compressing the second data based on the first compression mode, the third check value is obtained by the sending device by processing the fourth check value based on the first check algorithm, and the fourth check value is obtained by the sending device by processing the second compressed data based on the second check algorithm;

the receiving device obtains the fourth check value by processing, based on the second check algorithm, the second compressed data included in the second packet;

the receiving device obtains the third check value by processing the obtained fourth check value based on the first check algorithm;

the receiving device determines, on the basis that the obtained third check value is the same as the third check value included in the second packet, that the first check algorithm is a check algorithm used when the sending device generates the second packet; and the receiving device determines, according to the first check algorithm that is used when the sending device generates the second packet and that is determined by the receiving device and the correspondence between the first check algorithm and the first compression mode, that the first compression mode is the compression mode used when the sending device compresses the second data.

In one embodiment, the receiving device sets the decompression mode currently used by the receiving device to the first decompression mode on the basis that the second decompression mode currently used by the receiving device is different from the first decompression mode includes:

the receiving device sets the decompression mode currently used by the receiving device to the first decompression mode on the basis that the second decompression mode currently used by the receiving device is different from the first decompression mode corresponding to the first compression mode that is used when the sending device compresses the first data and that is determined by the receiving device, and that the second decompression mode currently used by the receiving device is different from the first decompression mode corresponding to the first compression mode that is used when the sending device compresses the second data and that is determined by the receiving device.

It should be understood that a process in which the receiving device determines, according to the received second packet by using the method 1 or the method 2, the compression mode used when the sending device compresses the second data is similar to a process in which the receiving device determines, according to the received first packet, the compression mode used when the sending device compresses the first data. For brevity, details are not described herein again.

It should be further understood that sequence numbers of the foregoing processes do not mean execution sequences in this embodiment of the present disclosure. The execution sequences of the processes should be determined according to functions and internal logic of the processes, and should not be construed as any limitation on the implementation processes of this embodiment of the present disclosure. For example, S315 may be performed before S320 or after S320, or may be performed at the same time as S320. This is not particularly limited in the present disclosure.

Therefore, according to the method in this embodiment, the receiving device continuously determines, twice according to two packets continuously sent by the sending device, that compression modes used by the sending device are the first compression mode. The receiving device switches the currently used decompression mode to the first decompression mode corresponding to the first compression mode, so as to avoid a case in which the compression mode used by the sending device cannot be correctly determined based on a check value caused by a network transmission error, and reduce a probability of false determining and false switching performed by the receiving device.

With reference to FIG. 1 and FIG. 2, the data transmission method according to an embodiment of the present disclosure is described in detail above. With reference to FIG. 3, the data transmission method according to another embodiment of the present disclosure is described in detail below.

FIG. 3 is another schematic diagram of a data transmission method 100 according to an embodiment.

It should be understood that the method shown in FIG. 3 may be performed before the receiving device obtains the first data by decompressing, based on the first decompression mode, the first compressed data included in the first packet in S106 in FIG. 1. Before receiving the first packet, the receiving device may receive N packets, and determine that the N packets all include compressed data generated by the sending device by means of compression based on the first compression mode, where N is a natural number greater than or equal to 1. The another schematic flowchart of the method 100 according to an embodiment of the present disclosure shown in FIG. 2 shows a case in which N is equal to 1. FIG. 3 is a schematic diagram of a case in which N is greater than 1 in the method 100 according to an embodiment.

As shown in FIG. 3, before switching to a first compression mode, a sending device obtains compressed data (which is denoted as data L for ease of understanding and distinguishing, where L is a natural number greater than or equal to 1) by compressing data based on a second compression mode. The sending device obtains a check value (which is denoted as a check value 1 for ease of understanding and distinguishing) by processing the data L based on a check algorithm (which is denoted as a check algorithm 1 for ease of understanding and distinguishing) corresponding to the second compression mode. The sending device sends a packet (which is denoted as a packet L for ease of understanding and distinguishing) including the data L and the check value 1 to a receiving device.

It should be noted that a specific process of processing data by the sending device based on a check algorithm is described in detail above. For brevity, details are not described herein again.

After switching to the first compression mode, the sending device obtains compressed data (which is denoted as data (L+1) for ease of understanding and distinguishing) by compressing data based on the first compression mode. The sending device obtains a check value (which is denoted as a check value 2 for ease of understanding and distinguishing) by processing the data (L+1) based on a check algorithm (which is denoted as a check algorithm 2 for ease of understanding and distinguishing) corresponding to the first compression mode. The sending device sends a packet (which is denoted as a packet (L+1) for ease of understanding and distinguishing) including the data (L+1) and the check value 2 to the receiving device.

To avoid false determining of a compression mode that may be caused by an error occurring during transmission in a system, the receiving device may perform, a plurality of times, determining on a plurality of continuously received packets. The receiving device sets a currently used decompression mode to a decompression mode corresponding to a compression mode used by the sending device only when the receiving device continuously determines, a plurality of times, that compression modes used by the sending device are the same compression mode.

After obtaining the packet (L+1), the sending device obtains N pieces of compressed data by processing N consecutive pieces of to-be-transmitted data based on the first compression mode. The sending device may separately obtain N check values by processing the N pieces of compressed data based on the check algorithm (that is, the check algorithm 2) corresponding to the first compression mode, and further obtain N consecutive packets. The N packets correspond one-to-one to the N pieces of compressed data, and an $i^{th}$ packet includes an $i^{th}$ piece of compressed data, where i∈[1, N], and N is a natural number greater than or equal to 1. The sending device continuously sends the N packets to the receiving device, and the N packets are packets sent by the sending device after the packet (L+1).

The receiving device discards the N packets N times where one packet is discarded each time. During $i^{th}$ discard processing in the N-time discard processing, the receiving device discards an $i^{th}$ packet after determining, based on the $i^{th}$ packet, that a currently used second decompression mode is different from a first decompression mode corresponding to the first compression mode that is used by the sending device and that is determined by the receiving device. The receiving device may record, by using a counter, discard processing performed each time. After a counted number reaches N+1, that is, after the receiving device receives an $(L+N+1)^{th}$ packet (which is denoted as a packet (L+N+1) including data (L+N+1) and the check value 2), the receiving device sets the currently used decompression mode to the first decompression mode corresponding to the first compression mode. When receiving an $(L+N+2)^{th}$ packet (which is denoted as a packet (L+N+2)), the receiving device obtains data by decompressing compressed data (which is denoted as data (L+N+2)) in the packet based on the first decompression mode.

In one embodiment, a value of N is 10.

That is, after the sending device compresses the data based on the first compression mode, generates the packet (L+1), and continuously sends ten packets, the receiving device sets the decompression mode to the first decompression mode and receives a packet following the ten continuously sent packets, thereby ensuring an extremely low probability of false switching.

Therefore, according to the data transmission method in this embodiment, the receiving device continuously determines a plurality of times, according to a plurality of packets continuously sent by the sending device, that compression modes used by the sending device are the first compression mode. The receiving device switches the currently used decompression mode to the first decompression mode corresponding to the first compression mode, so as to avoid a case in which the compression mode used by the sending device cannot be correctly determined based on a check value caused by a network transmission error, and reduce a probability of false determining and false switching performed by the receiving device. It should be noted that data included in the (N+1) packets may be same data or different data. This is not particularly limited in the present disclosure. In addition, when the (N+1) pieces of data are the same data, data loss may be reduced, and transmission interruption time may be reduced.

It should be understood that the foregoing illustrated first compression mode, check algorithm 2 corresponding to the first compression mode, check value 2, data (L+1), packet (L+1), data (L+N+1), packet (L+N+1), data (L+N+2), packet (L+N+2), second compression mode, check algorithm 1 corresponding to the second compression mode, check value 1, and packet L are described as examples, and should not be construed as any limitation on the present disclosure. L, L+1, L+N+1, L+N+2 are used to distinguish different packets and data, and should not be construed as any limitation on the present disclosure. The first compression mode and the second compression mode are merely described as examples, and the sending device may switch from a third compression mode to the first compression mode. This is not particularly limited in the present disclosure.

Figure 4:
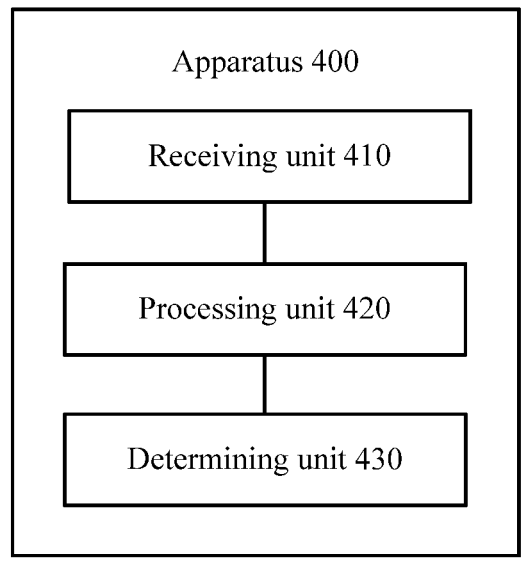
FIG. 4 is a schematic block diagram of a data transmission apparatus according to an embodiment.
Figure 5:
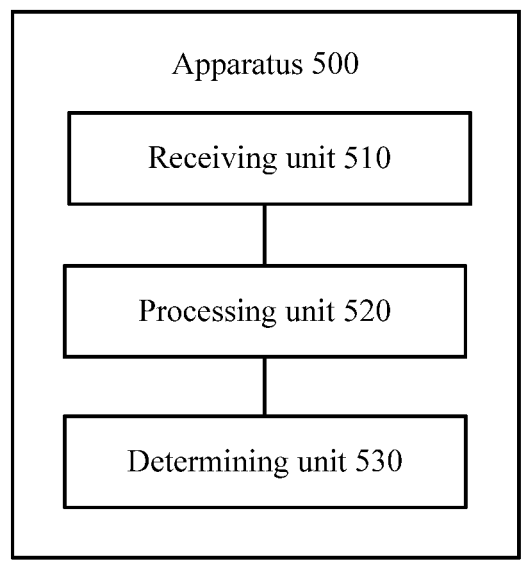
FIG. 5 is a schematic block diagram of a data transmission apparatus according to another embodiment.

With reference to FIG. 1 to FIG. 3, the data transmission method according to the embodiments of the present disclosure is described in detail above. With reference to FIG. 4, FIG. 5, and FIG. 6, a data transmission apparatus according to the embodiments of the present disclosure is described in detail below.

FIG. 4 is a schematic block diagram of a data transmission apparatus 400 according to an embodiment. The apparatus 400 may be configured to implement the receiving device in the method shown in FIG. 1 to FIG. 3. As shown in FIG. 4, the apparatus 400 includes a receiving unit 410, a processing unit 420, and a determining unit 430.

The receiving unit 410 is configured to receive a first packet sent by a sending device, where the first packet includes first compressed data and a first check value, the first compressed data is obtained by the sending device by compressing first data based on a first compression mode, the first check value is obtained by the sending device by processing a second check value based on a first check algorithm, and the second check value is obtained by the sending device by processing the first compressed data based on a second check algorithm.

The processing unit 420 is configured to obtain a first check code by processing, based on a third check algorithm, the first packet received by the receiving unit 410, where the second check algorithm and the third check algorithm include a same generator polynomial.

The determining unit 430 is configured to determine, according to the first check code obtained by the processing unit 420 and a correspondence between the first check code and the first compression mode, that the first compression mode is a compression mode used when the sending device compresses the first data.

The processing unit 420 is further configured to obtain the first data by decompressing, based on a first decompression mode, the first compressed data included in the first packet received by the receiving unit 410, where the first decompression mode is a decompression mode corresponding to the first compression mode determined by the determining unit 430.

In one embodiment, the determining unit 430 is further configured to: after the determining unit 430 determines, according to the first check code obtained by the processing unit 420 and the correspondence between the first check code and the first compression mode, that the first compression mode is the compression mode used when the sending device compresses the first data, and before the processing unit 420 obtains the first data by decompressing, based on the first decompression mode, the first compressed data included in the first packet received by the receiving unit 410, determine that a second decompression mode currently used by the apparatus 400 is different from the first decompression mode corresponding to the first compression mode that is used when the sending device compresses the first data and that is determined by the determining unit 430.

The processing unit 420 is further configured to set the decompression mode currently used by the apparatus 400 to the first decompression mode based on a fact, determined by the determining unit 430, that the second decompression mode currently used by the apparatus 400 is different from the first decompression mode.

In one embodiment, the receiving unit 410 is further configured to: before the processing unit 420 sets the decompression mode currently used by the apparatus 400 to the first decompression mode based on a fact, determined by the determining unit 430, that the second decompression mode currently used by the apparatus 400 is different from the first decompression mode, receive a second packet sent by the sending device, where the second packet includes second compressed data and a third check value, the second compressed data is obtained by the sending device by compressing second data based on the first compression mode, the third check value is obtained by the sending device by processing a fourth check value based on the first check algorithm, and the fourth check value is obtained by the sending device by processing the second compressed data based on the second check algorithm.

The processing unit 420 is further configured to obtain the first check code by processing, based on the third check algorithm, the second packet received by the receiving unit 410.

The determining unit 430 is further configured to determine, according to the first check code obtained by the processing unit 420 and the correspondence between the first check code and the first compression mode, that the first compression mode is a compression mode used when the sending device compresses the second data.

The processing unit 420 is configured to set the decompression mode currently used by the apparatus 400 to the first decompression mode based on a fact, determined by the first determining unit 430, that the second decompression mode currently used by the apparatus 400 is different from the first decompression mode corresponding to the first compression mode that is used when the sending device compresses the first data and that is determined by the determining unit 430, and based on a fact, determined by the determining unit 430, that the second decompression mode currently used by the apparatus 400 is different from the first decompression mode corresponding to the first compression mode that is used when the sending device compresses the second data and that is determined by the determining unit 430.

The data transmission apparatus 400 according to this embodiment may correspond to the receiving device configured to perform the method 1 in the data transmission method according to the embodiments of the present disclosure, and the units in the apparatus 400 and other operations and/or functions are respectively intended to implement the corresponding processes of the method in FIG. 1 to FIG. 3. For brevity, details are not described herein again.

Therefore, the data transmission apparatus in this embodiment of the present disclosure receives a packet sent by the sending device, processes a check value included in the packet, and obtains a check code used to determine a compression mode. The apparatus determines, according to a correspondence between the check code and the compression mode, the compression mode used when the sending device generates the compressed data. The compression mode is indicated by using the check code, so that overheads are reduced, and system compatibility and extensibility are implemented.

FIG. 5 is a schematic block diagram of a data transmission apparatus 500 according to another embodiment. The apparatus 500 may be configured to implement the receiving device in the method shown in FIG. 1 to FIG. 3. As shown in FIG. 5, the apparatus 500 includes a receiving unit 510, a processing unit 520, and a determining unit 530.

The receiving unit 510 is configured to receive a first packet sent by a sending device, where the first packet includes first compressed data and a first check value, the first compressed data is obtained by the sending device by compressing first data based on a first compression mode, the first check value is obtained by the sending device by processing a second check value based on a first check algorithm, and the second check value is obtained by the sending device by processing the first compressed data based on a second check algorithm.

The processing unit 520 is configured to: obtain the second check value by processing, based on the second check algorithm, the first compressed data included in the first packet received by the receiving unit 510; and obtain the first check value by processing, based on the first check algorithm, the second check value obtained by the processing unit 520.

The determining unit 530 is configured to: determine, on the basis that the first check value obtained by the processing unit 520 is the same as the first check value included in the first packet received by the receiving unit 510, that the first check algorithm is a check algorithm used when the sending device generates the first packet; and determine, according to the first check algorithm that is used when the sending device generates the first packet and that is determined by the determining unit 530 and a correspondence between the first check algorithm and the first compression mode, that the first compression mode is a compression mode used when the sending device compresses the first data.

The processing unit 520 is further configured to obtain the first data by decompressing, based on a first decompression mode, the first compressed data included in the first packet received by the receiving unit 510, where the first decompression mode is a decompression mode corresponding to the first compression mode determined by the determining unit 530.

In one embodiment, the processing unit 520 is configured to obtain a plurality of check values by separately processing, based on a plurality of check algorithms, the second check value obtained by the processing unit 520, where the plurality of check values include the first check value, and the plurality of check values correspond one-to-one to the plurality of check algorithms.

In one embodiment, the determining unit 530 is further configured to: after the determining unit 530 determines, according to the first check algorithm that is used when the sending device generates the first packet and that is determined by the determining unit 530 and the correspondence between the first check algorithm and the first compression mode, that the first compression mode is the compression mode used when the sending device compresses the first data, and before the processing unit 520 obtains the first data by decompressing, based on the first decompression mode, the first compressed data included in the first packet received by the receiving unit 510, determine that a second decompression mode currently used by the apparatus 500 is different from the first decompression mode corresponding to the first compression mode that is used when the sending device compresses the first data and that is determined by the determining unit 530.

The processing unit 520 is further configured to set the decompression mode currently used by the apparatus 500 to the first decompression mode based on a fact, determined by the determining unit 530, that the second decompression mode currently used by the apparatus 500 is different from the first decompression mode corresponding to the first compression mode that is used when the sending device compresses the first data and that is determined by the determining unit 530.

In one embodiment, the receiving unit 510 is further configured to: before the processing unit 520 sets the decompression mode currently used by the apparatus 500 to the first decompression mode on the basis that the second decompression mode currently used by the apparatus 500 is different from the first decompression mode corresponding to the first compression mode that is used when the sending device compresses the first data and that is determined by the determining unit 530, receive a second packet sent by the sending device, where the second packet includes second compressed data and a third check value, the second compressed data is obtained by the sending device by compressing second data based on the first compression mode, the third check value is obtained by the sending device by processing a fourth check value based on the first check algorithm, and the fourth check value is obtained by the sending device by processing the second compressed data based on the second check algorithm.

The processing unit 520 is further configured to: obtain the fourth check value by processing, based on the second check algorithm, the second compressed data included in the second packet received by the receiving unit 510; and obtain the third check value by processing, based on the first check algorithm, the fourth check value obtained by the processing unit 520.

The determining unit 530 is further configured to: determine, on the basis that the third check value obtained by the processing unit 520 is the same as the third check value included in the second packet received by the receiving unit 510, that the first check algorithm is a check algorithm used when the sending device generates the second packet; and determine, according to the check algorithm that is used when the sending device generates the second packet and that is determined by the determining unit 530 and the correspondence between the first check algorithm and the first compression mode, that the first compression mode is a compression mode used when the sending device compresses the second data.

The processing unit 520 is configured to set the decompression mode currently used by the apparatus 500 to the first decompression mode based on a fact, determined by the determining unit 530, that the second decompression mode currently used by the apparatus 500 is different from the first decompression mode corresponding to the first compression mode that is used when the sending device compresses the first data and that is determined by the determining unit 530, and based on a fact, determined by the determining unit 530, that the second decompression mode currently used by the apparatus 500 is different from the first decompression mode corresponding to the first compression mode that is used when the sending device compresses the second data and that is determined by the determining unit 530.

The data transmission apparatus 500 according to this embodiment of the present disclosure may correspond to the receiving device configured to perform the method 2 in the data transmission method according to the embodiments of the present disclosure, and the units in the apparatus 500 and other operations and/or functions are respectively intended to implement the corresponding processes of the method in FIG. 1 to FIG. 3. For brevity, details are not described herein again.

Therefore, the data transmission apparatus in this embodiment of the present disclosure receives a packet sent by the sending device and processes the packet, to determine a check algorithm the same as that of the sending device. The receiving device determines, according to a correspondence between the check algorithm and a compression mode, the compression mode used when the sending device generates the compressed data. The compression mode is indicated by using the check algorithm, so that overheads are reduced, and system compatibility and extensibility are implemented.

FIG. 6 is a schematic block diagram of a data transmission apparatus 600 according to still another embodiment. The apparatus 600 may be configured to implement the sending device in the method shown in FIG. 1 to FIG. 3. As shown in FIG. 6, the apparatus 600 includes a processing unit 610 and a sending unit 620.

The processing unit 610 is configured to: obtain first compressed data by compressing first data based on a first compression mode; obtain a second check value by processing the first compressed data based on a second check algorithm; and obtain a first check value by processing the second check value based on a first check algorithm, where the first check algorithm corresponds to the first compression mode.

The sending unit 620 is configured to send a first packet to a receiving device, where the first packet includes the first compressed data and the first check value obtained by the processing unit 610.

In one embodiment, the apparatus 600 further includes an obtaining unit configured to obtain a one-to-one correspondence between a plurality of check algorithms and a plurality of compression modes, where the second check algorithm is different from any one of the plurality of check algorithms.

The processing unit 610 is further configured to determine the first check algorithm corresponding to the first compression mode according to the one-to-one correspondence between the plurality of check algorithms and the plurality of compression modes.

The data transmission apparatus 600 according to this embodiment may correspond to the sending device in the data transmission method according to the embodiments of the present disclosure, and the units in the apparatus 600 and other operations and/or functions are respectively intended to implement the corresponding processes of the method in FIG. 1 to FIG. 3. For brevity, details are not described herein again.

Therefore, the apparatus according to this embodiment generates a check value based on a check algorithm corresponding to a compression mode, and sends a packet including the check value and compressed data to the receiving device. The receiving device obtains, by processing the check value, a check code used to determine the compression mode. The receiving device determines, according to a correspondence between the check code and the compression mode, the compression mode used when the apparatus generates the compressed data. The compression mode is indicated by using the check code, so that overheads are reduced, and system compatibility and extensibility are implemented.

FIG. 7a and FIG. 7b are schematic block diagrams of a data transmission system 700 according to an embodiment.

As shown in FIG. 7a, the system 700 includes the data transmission apparatus 400 according to the embodiments of the present disclosure and the data transmission apparatus 600 according to the embodiments of the present disclosure. The data transmission apparatus 400 according to the embodiments of the present disclosure may correspond to the receiving device configured to perform the method 1 in the data transmission method according to the embodiments of the present disclosure, and the units in the apparatus 400 and other operations and/or functions are respectively intended to implement the corresponding processes of the method in FIG. 1 to FIG. 3. For brevity, details are not described herein again. The data transmission apparatus 600 according to the embodiments of the present disclosure may correspond to the sending device in the data transmission method according to the embodiments of the present disclosure, and the units in the apparatus 600 and other operations and/or functions are respectively intended to implement the corresponding processes of the method in FIG. 1 to FIG. 3. For brevity, details are not described herein again.

As shown in FIG. 7b, the system 700 includes the data transmission apparatus 500 according to the embodiments of the present disclosure and the data transmission apparatus 600 according to the embodiments of the present disclosure. The data transmission apparatus 500 according to the embodiments of the present disclosure may correspond to the receiving device configured to perform the method 2 in the data transmission method according to the embodiments of the present disclosure, and the units in the apparatus 500 and other operations and/or functions are respectively intended to implement the corresponding processes of the method in FIG. 1 to FIG. 3. For brevity, details are not described herein again. The data transmission apparatus 600 according to the embodiments may correspond to the sending device in the data transmission method according to the embodiments of the present disclosure, and the units in the apparatus 600 and other operations and/or functions are respectively intended to implement the corresponding processes of the method in FIG. 1 to FIG. 3. For brevity, details are not described herein again.

Therefore, in the system according to this embodiment, the sending device generates a check value based on a check algorithm corresponding to a compression mode, and sends a packet including the check value and compressed data to the receiving device. The receiving device obtains, by processing the check value, a check code used to determine the compression mode. The receiving device determines, according to a correspondence between the check code and the compression mode, the compression mode used when the sending device generates the compressed data. The compression mode is indicated by using the check code, so that overheads are reduced, and system compatibility and extensibility are implemented.

With reference to FIG. 4 to FIG. 7 (including FIG. 7a and FIG. 7b), the data transmission apparatus and system according to the embodiments of the present disclosure are described in detail above. With reference to FIG. 8 to FIG. 11 (including FIG. 11a and FIG. 11b), a data transmission device and system according to the embodiments of the present disclosure are described in detail below.

Figure 8:
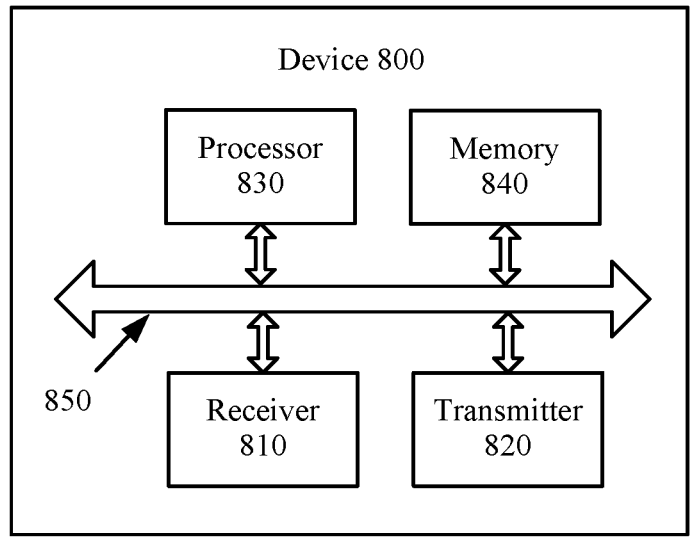
FIG. 8 is a schematic block diagram of a data transmission device according to an embodiment.

FIG. 8 is a schematic block diagram of a data transmission device 800 according to an embodiment. The device 800 may be configured to implement the receiving device in the method shown in FIG. 1 to FIG. 3. The device 800 may be configured to implement the apparatus 400 shown in FIG. 4. As shown in FIG. 8, the device 800 includes a receiver 810, a transmitter 820, a processor 830, a memory 840, and a bus system 850. The receiver 810, the transmitter 820, the processor 830, and the memory 840 are connected by using the bus system 850. The memory 840 is configured to store an instruction. The processor 830 is configured to execute the instruction stored in the memory 840, to control the receiver 810 to receive a signal and control the transmitter 820 to send a signal.

The receiver 810 is configured to receive a first packet sent by a sending device, where the first packet includes first compressed data and a first check value, the first compressed data is obtained by the sending device by compressing first data based on a first compression mode, the first check value is obtained by the sending device by processing a second check value based on a first check algorithm, and the second check value is obtained by the sending device by processing the first compressed data based on a second check algorithm.

The processor 830 is configured to: obtain a first check code by processing, based on a third check algorithm, the first packet received by the receiver 810, where the second check algorithm and the third check algorithm include a same generator polynomial; determine, according to the first check code obtained by the processor 830 and a correspondence between the first check code and the first compression mode, that the first compression mode is a compression mode used when the sending device compresses the first data; and obtain the first data by decompressing, based on a first decompression mode, the first compressed data included in the first packet received by the receiver 810, where the first decompression mode is a decompression mode corresponding to the first compression mode determined by the processor 830. In one embodiment, the processor 830 is further configured to: after the processor 830 determines, according to the first check code obtained by the processor 830 and the correspondence between the first check code and the first compression mode, that the first compression mode is the compression mode used when the sending device compresses the first data, and before the processor 830 obtains the first data by decompressing, based on the first decompression mode, the first compressed data included in the first packet received by the receiver 810, determine that a second decompression mode currently used by the device 800 is different from the first decompression mode corresponding to the first compression mode that is used when the sending device compresses the first data and that is determined by the processor 830.

The processor 830 is further configured to set the decompression mode currently used by the device 800 to the first decompression mode based on a fact, determined by the processor 830, that the second decompression mode currently used by the device 800 is different from the first decompression mode.

In one embodiment, the receiver 810 is further configured to: before the processor 830 sets the decompression mode currently used by the device 800 to the first decompression mode based on a fact, determined by the processor 830, that the second decompression mode currently used by the device 800 is different from the first decompression mode, receive a second packet sent by the sending device, where the second packet includes second compressed data and a third check value, the second compressed data is obtained by the sending device by compressing second data based on the first compression mode, the third check value is obtained by the sending device by processing a fourth check value based on the first check algorithm, and the fourth check value is obtained by the sending device by processing the second compressed data based on the second check algorithm.

The processor 830 is further configured to obtain the first check code by processing, based on the third check algorithm, the second packet received by the receiver 810.

The processor 830 is further configured to determine, according to the first check code obtained by the processor 830 and the correspondence between the first check code and the first compression mode, that the first compression mode is a compression mode used when the sending device compresses the second data.

The processor 830 is configured to set the decompression mode currently used by the device 800 to the first decompression mode based on a fact, determined by the processor 830, that the second decompression mode currently used by the device 800 is different from the first decompression mode corresponding to the first compression mode that is used when the sending device compresses the first data and that is determined by the processor 830, and based on a fact, determined by the processor 830, that the second decompression mode currently used by the device 800 is different from the first decompression mode corresponding to the first compression mode that is used when the sending device compresses the second data and that is determined by the processor 830.

It should be understood that in this embodiment of the present disclosure, the processor 830 may be a central processing unit (CPU), or the processor 830 may be another general purpose processor, a digital signal processor (DSP), an application-specific integrated circuit (ASIC), a field programmable gate array (FPGA) or another programmable logic device, a discrete gate or a transistor logic device, discrete hardware component, or the like. The general purpose processor may be a microprocessor, or the processor may be any conventional processor, or the like.

The memory 840 may include a read-only memory and a random access memory, and provide an instruction and data to the processor 830. A part of the memory 840 may further include a nonvolatile random access memory. For example, the memory 840 may further store information about a device type.

The bus system 850 may further include a power bus, a control bus, a status signal bus, and the like, in addition to a data bus. However, for clear description, various types of buses in the figure are marked as the bus system 850.

In an implementation process, steps in the foregoing methods may be completed by using an integrated logic circuit of hardware in the processor 830 or an instruction in a form of software. The steps of the data transmission method disclosed with reference to the embodiments of the present disclosure may be directly performed and completed by a hardware processor, or performed and completed by a combination of hardware in the processor and a software module. The software module may be located in a mature storage medium in the art, such as a random access memory, a flash memory, a read-only memory, a programmable read-only memory, an electrically erasable programmable memory, or a register. The storage medium is located in the memory 840, and the processor 830 reads information in the memory 840 and completes the steps in the foregoing method in combination with hardware of the processor. To avoid repetition, details are not described herein again.

The data transmission device 800 according to this embodiment of the present disclosure may correspond to the receiving device configured to perform the method 1 in the data transmission method according to the embodiments of the present disclosure and the data transmission apparatus 400 according to the embodiments of the present disclosure. The modules in the device 800 and other operations and/or functions are respectively intended to implement the corresponding processes of the method in FIG. 1 to FIG. 3. For brevity, details are not described herein again.

Therefore, the data transmission device in this embodiment receives a packet sent by the sending device, processes a check value included in the packet, and obtains a check code used to determine a compression mode. The device determines, according to a correspondence between the check code and the compression mode, the compression mode used when the sending device generates the compressed data. The compression mode is indicated by using the check code, so that overheads are reduced, and system compatibility and extensibility are implemented.

Figure 9:
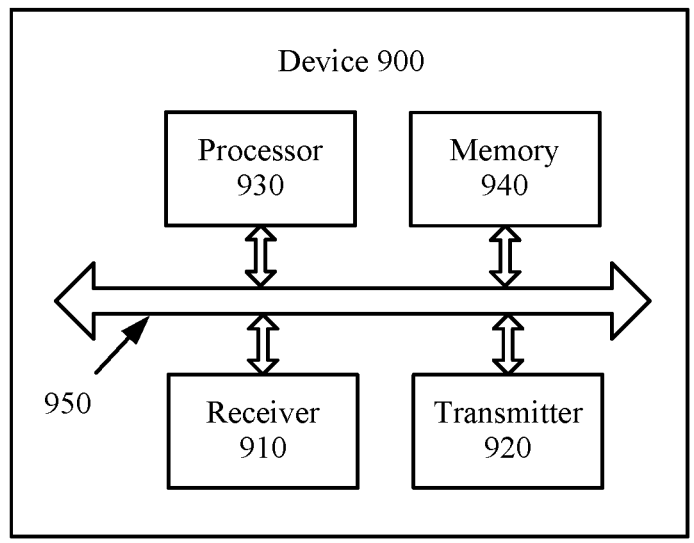
FIG. 9 is a schematic block diagram of a data transmission device according to another embodiment.

FIG. 9 is a schematic block diagram of a data transmission device 900 according to another embodiment. The device 900 may be configured to implement the receiving device in the method shown in FIG. 1 to FIG. 3. The device 900 may be configured to implement the apparatus 500 shown in FIG. 5. As shown in FIG. 9, the device 900 includes a receiver 910, a transmitter 920, a processor 930, a memory 940, and a bus system 950. The receiver 910, the transmitter 920, the processor 930, and the memory 940 are connected by using the bus system 950. The memory 940 is configured to store an instruction. The processor 930 is configured to execute the instruction stored in the memory 940, to control the receiver 910 to receive a signal and control the transmitter 920 to send a signal.

The receiver 910 is configured to receive a first packet sent by a sending device, where the first packet includes first compressed data and a first check value, the first compressed data is obtained by the sending device by compressing first data based on a first compression mode, the first check value is obtained by the sending device by processing a second check value based on a first check algorithm, and the second check value is obtained by the sending device by processing the first compressed data based on a second check algorithm.

The processor 930 is configured to: obtain the second check value by processing, based on the second check algorithm, the first compressed data included in the first packet received by the receiver 910; obtain the first check value by processing, based on the first check algorithm, the second check value obtained by the processor 930; determine, on the basis that the first check value obtained by the processor 930 is the same as the first check value included in the first packet received by the receiver 910, that the first check algorithm is a check algorithm used when the sending device generates the first packet; determine, according to the first check algorithm that is used when the sending device generates the first packet and that is determined by the processor 930 and a correspondence between the first check algorithm and the first compression mode, that the first compression mode is a compression mode used when the sending device compresses the first data; and obtain the first data by decompressing, based on a first decompression mode, the first compressed data included in the first packet received by the receiver 910, where the first decompression mode is a decompression mode corresponding to the first compression mode determined by the processor 930. In one embodiment, the processor 930 is configured to obtain a plurality of check values by separately processing, based on a plurality of check algorithms, the second check value obtained by the processor 930, where the plurality of check values include the first check value, and the plurality of check values correspond one-to-one to the plurality of check algorithms.

In one embodiment, the processor 930 is further configured to: after the processor 930 determines, according to the first check algorithm that is used when the sending device generates the first packet and that is determined by the processor 930 and the correspondence between the first check algorithm and the first compression mode, that the first compression mode is the compression mode used when the sending device compresses the first data, and before the processor 930 obtains the first data by decompressing, based on the first decompression mode, the first compressed data included in the first packet received by the receiver 910, determine that a second decompression mode currently used by the device 900 is different from the first decompression mode corresponding to the first compression mode that is used when the sending device compresses the first data and that is determined by the processor 930.

The processor 930 is further configured to set the decompression mode currently used by the device 900 to the first decompression mode based on a fact, determined by the processor 930, that the second decompression mode currently used by the device 900 is different from the first decompression mode corresponding to the first compression mode that is used when the sending device compresses the first data and that is determined by the processor 930.

In one embodiment, the receiver 910 is further configured to: before the processor 930 sets the decompression mode currently used by the device 900 to the first decompression mode on the basis that the second decompression mode currently used by the device 900 is different from the first decompression mode corresponding to the first compression mode that is used when the sending device compresses the first data and that is determined by the processor 930, receive a second packet sent by the sending device, where the second packet includes second compressed data and a third check value, the second compressed data is obtained by the sending device by compressing second data based on the first compression mode, the third check value is obtained by the sending device by processing a fourth check value based on the first check algorithm, and the fourth check value is obtained by the sending device by processing the second compressed data based on the second check algorithm.

The processor 930 is further configured to: obtain the fourth check value by processing, based on the second check algorithm, the second compressed data included in the second packet received by the receiver 910; and obtain the third check value by processing, based on the first check algorithm, the fourth check value obtained by the processor 930.

The processor 930 is further configured to: determine, on the basis that the third check value obtained by the processor 930 is the same as the third check value included in the second packet received by the receiver 910, that the first check algorithm is a check algorithm used when the sending device generates the second packet; and determine, according to the check algorithm that is used when the sending device generates the second packet and that is determined by the processor 930 and the correspondence between the first check algorithm and the first compression mode, that the first compression mode is a compression mode used when the sending device compresses the second data.

The processor 930 is configured to set the decompression mode currently used by the device 900 to the first decompression mode based on a fact, determined by the processor 930, that the second decompression mode currently used by the device 900 is different from the first decompression mode corresponding to the first compression mode that is used when the sending device compresses the first data and that is determined by the processor 930, and based on a fact, determined by the processor 930, that the second decompression mode currently used by the device 900 is different from the first decompression mode corresponding to the first compression mode that is used when the sending device compresses the second data and that is determined by the processor 930.

The data transmission device 900 according to this embodiment may correspond to the receiving device configured to perform the method 2 in the data transmission method according to the embodiments of the present disclosure and the data transmission apparatus 500 according to the embodiments of the present disclosure. The modules in the device 900 and other operations and/or functions are respectively intended to implement the corresponding processes of the method in FIG. 1 to FIG. 3. For brevity, details are not described herein again.

Therefore, the data transmission device in this embodiment receives a packet sent by the sending device and processes the packet, to determine a check algorithm the same as that of the sending device. The receiving device determines, according to a correspondence between the check algorithm and a compression mode, the compression mode used when the sending device generates the compressed data. The compression mode is indicated by using the check algorithm, so that overheads are reduced, and system compatibility and extensibility are implemented.

FIG. 10 is a schematic block diagram of a data transmission device 1000 according to still another embodiment. The device 1000 may be configured to implement the sending device in the method shown in FIG. 1 to FIG. 3. The device 1000 may be configured to implement the apparatus 600 shown in FIG. 6. As shown in FIG. 10, the device 1000 includes a receiver 1100, a transmitter 1200, a processor 1300, a memory 1400, and a bus system 1500. The receiver 1100, the transmitter 1200, the processor 1300, and the memory 1400 are connected by using the bus system 1500. The memory 1400 is configured to store an instruction. The processor 1300 is configured to execute the instruction stored in the memory 1400, to control the receiver 1100 to receive a signal and control the transmitter 1200 to send a signal.

The processor 1300 is configured to: obtain first compressed data by compressing first data based on a first compression mode; obtain a second check value by processing the first compressed data based on a second check algorithm; and obtain a first check value by processing the second check value based on a first check algorithm, where the first check algorithm corresponds to the first compression mode.

The transmitter 1200 is configured to send a first packet to a receiving device, where the first packet includes the first compressed data and the first check value obtained by the processor 1300.

In one embodiment, the processor 1300 is further configured to obtain a one-to-one correspondence between a plurality of check algorithms and a plurality of compression modes, where the second check algorithm is different from any one of the plurality of check algorithms.

The processor 1300 is further configured to determine the first check algorithm corresponding to the first compression mode according to the one-to-one correspondence between the plurality of check algorithms and the plurality of compression modes.

The data transmission device 1000 according to this embodiment may correspond to the sending device in the data transmission method according to the embodiments of the present disclosure, and the modules in the device 1000 and other operations and/or functions are respectively intended to implement the corresponding processes of the method in FIG. 1 to FIG. 3. For brevity, details are not described herein again.

Therefore, the device according to this embodiment generates a check value based on a check algorithm corresponding to a compression mode, and sends a packet including the check value and compressed data to the receiving device. The receiving device obtains, by processing the check value, a check code used to determine the compression mode. The receiving device determines, according to a correspondence between the check code and the compression mode, the compression mode used when the device generates the compressed data. The compression mode is indicated by using the check code, so that overheads are reduced, and system compatibility and extensibility are implemented.

FIG. 11a and FIG. 11b are schematic block diagrams of a data transmission system 2000 according to an embodiment.

As shown in FIG. 11a, the system 2000 includes the data transmission device 800 according to the embodiments of the present disclosure and the data transmission device 1000 according to the embodiments of the present disclosure. The data transmission device 800 according to the embodiments of the present disclosure may correspond to the receiving device configured to perform the method 1 in the data transmission method according to the embodiments of the present disclosure and the data transmission apparatus 400 according to the embodiments of the present disclosure, and the modules in the device 800 and other operations and/or functions are respectively intended to implement the corresponding processes of the method in FIG. 1 to FIG. 3. For brevity, details are not described herein again. The data transmission device 1000 according to the embodiments of the present disclosure may correspond to the sending device in the data transmission method according to the embodiments of the present disclosure and the data transmission apparatus 600 according to the embodiments of the present disclosure, and the modules in the device 1000 and other operations and/or functions are respectively intended to implement the corresponding processes of the method in FIG. 1 to FIG. 3. For brevity, details are not described herein again.

As shown in FIG. 11b, the system 2000 includes the data transmission device 900 according to the embodiments of the present disclosure and the data transmission device 1000 according to the embodiments of the present disclosure. The data transmission device 900 according to the embodiments of the present disclosure may correspond to the receiving device configured to perform the method 2 in the data transmission method according to the embodiments of the present disclosure and the data transmission apparatus 500 according to the embodiments of the present disclosure, and the modules in the device 900 and other operations and/or functions are respectively intended to implement the corresponding processes of the method in FIG. 1 to FIG. 3. For brevity, details are not described herein again. The data transmission device 1000 according to the embodiments of the present disclosure may correspond to the sending device in the data transmission method according to the embodiments of the present disclosure and the data transmission apparatus 600 according to the embodiments of the present disclosure, and the modules in the device 1000 and other operations and/or functions are respectively intended to implement the corresponding processes of the method in FIG. 1 to FIG. 3. For brevity, details are not described herein again.

Therefore, in the system according to this embodiment, the sending device generates a check value based on a check algorithm corresponding to a compression mode, and sends a packet including the check value and compressed data to the receiving device. The receiving device obtains, by processing the check value, a check code used to determine the compression mode. The receiving device determines, according to a correspondence between the check code and the compression mode, the compression mode used when the sending device generates the compressed data. The compression mode is indicated by using the check code, so that overheads are reduced, and system compatibility and extensibility are implemented.

It should be understood that sequence numbers of the foregoing processes do not mean execution sequences in various embodiments of the present disclosure. The execution sequences of the processes should be determined according to functions and internal logic of the processes, and should not be construed as any limitation on the implementation processes of the embodiments of the present disclosure.

A person of ordinary skill in the art may be aware that, in combination with the examples described in the embodiments disclosed in this specification, units and algorithm steps may be implemented by electronic hardware or a combination of computer software and electronic hardware. Whether the functions are performed by hardware or software depends on particular applications and design constraint conditions of the technical solutions. A person skilled in the art may use different methods to implement the described functions for each particular application.

It may be clearly understood by a person skilled in the art that, for the purpose of convenient and brief description, for a detailed working process of the foregoing system, apparatus, and unit, refer to a corresponding process in the foregoing method embodiments, and details are not described herein again.

In the several embodiments provided in this application, it should be understood that the disclosed system, apparatus, and method may be implemented in other manners. For example, the described apparatus embodiment is merely an example. For example, the unit division is merely logical function division and may be other division in actual implementation. For example, a plurality of units or components may be combined or integrated into another system, or some features may be ignored or not performed. In addition, the displayed or discussed mutual couplings or direct couplings or communication connections may be implemented by using some interfaces. The indirect couplings or communication connections between the apparatuses or units may be implemented in electronic, mechanical, or other forms.

The units described as separate parts may or may not be physically separate, and parts displayed as units may or may not be physical units, may be located in one position, or may be distributed on a plurality of network units. Some or all of the units may be selected according to actual requirements to achieve the objectives of the solutions of the embodiments.

In addition, functional units in the embodiments of the present disclosure may be integrated into one processing unit, or each of the units may exist alone physically, or two or more units are integrated into one unit.

When the functions are implemented in a form of a software functional unit and sold or used as an independent product, the functions may be stored in a computer readable storage medium. Based on such an understanding, the technical solutions of the present disclosure essentially, or the part contributing to the prior art, or some of the technical solutions may be implemented in a form of a software product. The computer software product is stored in a storage medium, and includes several instructions for instructing a computer device (which may be a personal computer, a server, a network device, or the like) to perform all or some of the steps of the methods described in the embodiments of the present disclosure. The foregoing storage medium includes: any medium that can store program code, such as a Universal Serial Bus (USB) flash drive, a removable hard disk, a read-only memory (ROM), a random access memory (RAM), a magnetic disk, or an optical disc.

The foregoing descriptions are merely specific implementations of the present disclosure.

What is claimed is:

1. A computer-implemented method of data transmission to determine packet's compression type without using extra overhead byte in a packet header, the method comprising:

receiving, by a receiving device from a sending device, a first packet, wherein prior to receiving the first packet, the sending device generated first compressed data by compressing first data based on a first compression mode, the first compression mode corresponding to a first check algorithm and a second compression mode corresponding to a second check algorithm, obtained a second check value by processing the first compressed data based on the second check algorithm, the second check algorithm including a cyclic redundancy check (CRC), and obtained a first check value by processing the second check value based on the first check algorithm, wherein the second check value comprises a CRC value that is not included in a header of the first packet, wherein the first packet comprises the header of the first packet, the first compressed data in a compressed field of a payload of the first packet, and the first check value in a non-compressed field of the payload of the first packet indicating that the first compression mode was used by the sending device, wherein the first check value is generated by the sending device, wherein the first check value is not included in the header of the first packet, wherein no overhead byte in the header of the first packet needs to be reserved for the first check value;

processing, by the receiving device, the first packet based on a third check algorithm to obtain a first check code, wherein the second check algorithm and the third check algorithm comprise a same generator polynomial;

determining, according to the obtained first check code and a correspondence between the first check code and the first compression mode, that the first compression mode is used to compress the first data by the sending device; and decompressing, based on a first decompression mode, the first compressed data to obtain the first data, wherein the first decompression mode is corresponding to the first compression mode.

2. The method according to claim 1, further comprising: after determining, by the receiving device, that the first compression mode is used to compress the first data by the sending device, and before decompressing the first compressed data to obtain the first data, determining that an original decompression mode currently used by the receiving device is different from the first decompression mode corresponding to the first compression mode that is used to compress the first data by the sending device; and setting the original decompression mode to the first decompression mode on the basis that the original decompression mode currently used by the receiving device is not the first decompression mode.

3. The method according to claim 2, further comprising: before setting the original decompression mode to the first decompression mode, receiving, from the sending device, a second packet comprising second compressed data and a third check value, wherein the sending device generates the second compressed data by compressing second data based on the first compression mode, obtains a forth check value by processing the third check value based on the first check algorithm, and obtains the third check value by processing the forth check value based on the second check algorithm;

processing the second packet based on the third check algorithm to obtain the first check code; and determining, according to the obtained first check code and the correspondence between the first check code and the first compression mode, that the first compression mode is used to compress the second data;

wherein setting the original decompression mode to the first decompression mode comprises:

setting the original decompression mode to the first decompression mode on the basis that the original decompression mode currently used by the receiving device is different from the first decompression mode corresponding to the first compression mode that is used to compress the first data by the sending device, and that the original decompression mode currently used by the receiving device is different from the first decompression mode corresponding to the first compression mode that is used to compress the second data.

4. The method according to claim 1, wherein the first compression mode comprises: an Ethernet frame header compression mode, an Internet Protocol (IP) frame header compression mode, or an Ethernet frame header and IP frame header compression mode.

5. A computer-implemented method of data transmission to determine packet's compression type without using extra overhead byte in a packet header, the method comprising:
receiving, by a receiving device from a sending device, a first packet, wherein, prior to receiving the first packet, the sending device generated first compressed data by compressing first data based on a first compression mode, the first compression mode corresponding to a first check algorithm and a second compression mode corresponding to a second check algorithm, obtained a second check value by processing the first compressed databased on the second check algorithm, the second check algorithm including a cyclic redundancy check (CRC), and obtained a first check value by processing the second check value based on the first check algorithm, wherein the second check value comprises a CRC value that is not included in a header of the first packet; processing, based on the second check algorithm, the first compressed data to obtain the second check value; receiving, from the sending device, wherein the first packet comprises the header of the first packet, the first compressed data in a compressed field of a payload of the first packet, and the first check value in a non-compressed field of the payload of the first packet indicating that the first compression mode was used by the sending device, wherein the first check value is generated by the sending device, wherein the first check value is not included in the header of the first packet, wherein no overhead byte in the header of the first packet needs to be reserved for the first check value; processing, by the receiving device, the obtained second check value based on the first check algorithm to obtain another first check value; determining, on the basis that the obtained other first check value is the same as the first check value comprised in the first packet, that the first check algorithm is used to generate the first packet; determining, according to the first check algorithm used to generate the first packet and a correspondence between the first check algorithm and the first compression mode, wherein the first compression mode is used to compress the first data; and decompressing, based on a first decompression mode, the first compressed data to obtain the first data, wherein the first decompression mode is corresponding to the first compression mode.

6. The method according to claim 5, wherein processing the obtained second check value based on the first check algorithm to obtain the other first check value comprises:
separately processing the second check value based on a plurality of check algorithms to obtain a plurality of check values, wherein the plurality of check values comprise the first check value, and correspond one-to-one to the plurality of check algorithms.

7. The method according to claim 5, further comprising:
after determining that the first compression mode is used to compress the first data, and before decompressing the first compressed data to obtain the first data,
determining that an original decompression mode currently used by the receiving device is different from the first decompression mode corresponding to the first compression mode that is used to compress the first data by the sending device; and
setting the original decompression mode to the first decompression mode on the basis that the original decompression mode currently used by the receiving device is not the first decompression mode.

8. The method according to claim 7, further comprising: before setting the original decompression mode to the first decompression mode on the basis that the original decompression mode currently used is different from the first decompression mode,
receiving, from the sending device, a second packet comprising a header of the second packet, second compressed data and a third check value, wherein the sending device generates the second compressed data by compressing second data based on the first compression mode, obtains a forth check value by processing the third check value based on the first check algorithm, and obtains the third check value by processing the forth check value based on the second check algorithm;
processing, based on the second check algorithm, the second compressed data to obtain a fourth check value;
processing the obtained fourth check value based on the first check algorithm to obtain another third check value;
determining, on the basis that the obtained other third check value is the same as the third check value comprised in the second packet, that the first check algorithm is used to generate the second packet; and
determining, according to the first check algorithm that is used to generate the second packet and the correspondence between the first check algorithm and the first compression mode, that the first compression mode is used to compress the second data;
wherein setting the original decompression mode to the first decompression mode on the basis that the original decompression mode currently used is different from the first decompression mode comprises:
setting the original decompression mode to the first decompression mode on the basis that the original decompression mode currently used by the receiving device is different from the first decompression mode corresponding to the first compression mode that is used to compress the first data by the sending device, and that the original decompression mode currently used by the receiving device is different from the first decompression mode corresponding to the first compression mode that is used to compress the second data.

9. The method according to claim 5, wherein the first compression mode comprises: an Ethernet frame header compression mode, an Internet Protocol (IP) frame header compression mode, or an Ethernet frame header and IP frame header compression mode.

10. A data transmission apparatus operating as a receiving device, comprising a processor and a memory coupled to the processor, wherein the memory stores instructions when executed by the processor cause the data transmission apparatus to:
receive, from a sending device, a first packet, wherein prior to receiving the first packet, the sending device generated the first compressed data by compressing first data based on a first compression mode, the first compression mode corresponding to a first check algorithm and a second compression mode corresponding to a second check algorithm, obtained a second check value by processing the first compressed data based on the second check algorithm, the second check algorithm including a cyclic redundancy check (CRC), and obtained a first check value by processing the second check value based on the first check algorithm, wherein the second check value comprises a CRC value that is not included in a header of the first packet, wherein the first packet comprises the header of the first packet, the first compressed data in a compressed field of a payload of the first packet, and the first check value in a non-compressed field of the payload of the first packet indicating that the first compression mode was used by the sending device, wherein the first check value is generated by the sending device, wherein the first check value is not included in the header of the first packet, wherein no overhead byte in the header of the first packet needs to be reserved for the first check value; process the first packet based on a third check algorithm to obtain a first check code, wherein the second check algorithm and the third check algorithm comprise a same generator polynomial; determine, according to the obtained first check code and a correspondence between the first check code and the first compression mode, that the first compression mode is used to compress the first data by the sending device; and decompress, based on a first decompression mode, the first compressed data to obtain the first data, wherein the first decompression mode is corresponding to the first compression mode.

11. The apparatus according to claim 10, wherein after determining that the first compression mode is used to compress the first data, and before decompressing the first compressed data to obtain the first data, the instructions further cause the data transmission apparatus to:

determine that an original decompression mode currently used is different from the first decompression mode corresponding to the first compression mode that is used to compress the first data; and set the original decompression mode to the first decompression mode responsive to the original decompression mode currently used is different from the first decompression mode.

12. The apparatus according to claim 11, wherein before setting the original decompression mode to the first decompression mode, the instructions further cause the data transmission apparatus to:

receive, from the sending device, a second packet comprising second compressed data and a third check value, wherein the sending device generates the second compressed data by compressing second data based on the first compression mode, obtains a fourth check value by processing a third check value based on the first check algorithm, and obtains the third check value by processing the fourth check value based on the second check algorithm;

process, based on the third check algorithm, the second packet to obtain the first check code;

determine, according to the first check code and the correspondence between the first check code and the first compression mode, that the first compression mode is used to compress the second data; and set the original decompression mode to the first decompression mode on the basis that the original decompression mode currently used is different from the first decompression mode corresponding to the first compression mode that is used to compress the first data by the sending device, and that the original decompression mode currently used is different from the first decompression mode corresponding to the first compression mode that is used to compress the second data.

13. A data transmission apparatus operating as a receiving device, comprising a processor and a memory coupled to the processor, wherein the memory stores instructions when executed by the processor cause the data transmission apparatus to:

receive, from a sending device, a first packet, wherein prior to receiving the first packet, the sending device generated the first compressed data by compressing first data based on a first compression mode, the first compression mode corresponding to a first check algorithm and a second compression mode corresponding to a second check algorithm, obtained a second check value by processing the first compressed data based on the second check algorithm, the second check algorithm including a cyclic redundancy check (CRC), and obtained a first check value by processing the second check value based on the first check algorithm, wherein the second check value comprises a CRC value that is not included in a header of the first packet, wherein the first packet comprises the header of the first packet, the first compressed data in a compressed field of a payload of the first packet, and the first check value in a non-compressed field of the payload of the first packet indicating that the first compression mode was used by the sending device, wherein the first check value is generated by the sending device, wherein the first check value is not included in the header of the first packet, wherein no overhead byte in the header of the first packet needs to be reserved for the first check value; process, based on the second check algorithm, the first compressed data to obtain the second check value; and process, based on the first check algorithm, the second check value to obtain another first check value; determine, on the basis that the other first check value is the same as the first check value comprised in the first packet, that the first check algorithm is used to generate the first packet; and determine, according to the first check algorithm used to generate the first packet and a correspondence between the first check algorithm and the first compression mode, that the first compression mode is used to compress the first data; and decompress, based on a first decompression mode, the first compressed data to obtain the first data, wherein the first decompression mode is corresponding to the first compression mode.

14. The apparatus according to claim 13, wherein the instructions further cause the data transmission apparatus to separately process, based on a plurality of check algorithms, the second check value to obtain a plurality of check values, wherein the plurality of check values comprise the first check value, and correspond one-to-one to the plurality of check algorithms.

15. The apparatus according to claim 13, wherein after determining that the first compression mode is used to compress the first data, and before decompressing the first compressed data to obtain the first data, the instructions further cause the data transmission apparatus to:

determine that an original decompression mode currently used is different from the first decompression mode corresponding to the first compression mode that is used to compress the first data by the sending device; and set the original decompression mode to the first decompression mode responsive to the original decompression mode currently used is different from the first decompression mode corresponding to the first compression mode that is used to compress the first data by the sending device.

16. The apparatus according to claim 15, wherein before setting the original decompression mode to the first decompression mode, the instructions further cause the data transmission apparatus to:
receive, from the sending device, a second packet comprising a header of the second packet, second compressed data and a third check value, wherein the sending device generates the second compressed data by compressing second data based on the first compression mode, obtains a fourth check value by processing the third check value based on the first check algorithm, and obtains the third check value by processing the fourth check value based on the second check algorithm;
process, based on the second check algorithm, the second compressed data to obtain the fourth check value;
process, based on the first check algorithm, the fourth check value to obtain another third check value;
determine, on the basis that the other third check value is the same as the third check value comprised in the second packet, that the first check algorithm is used to generate the second packet; and determine, according to the first check algorithm that is used to generate the second packet and the correspondence between the first check algorithm and the first compression mode, that the first compression mode is used to compress the second data; and
set the original decompression mode to the first decompression mode responsive to the original decompression mode currently used is different from the first decompression mode corresponding to the first compression mode that is used to compress the first data, and that the original decompression mode currently used is different from the first decompression mode corresponding to the first compression mode that is used to compress the second data.

* * * * *

UNITED STATES PATENT AND TRADEMARK OFFICE
CERTIFICATE OF CORRECTION

| | | |
|---|---|---|
| PATENT NO. | : 11,375,047 B2 | Page 1 of 1 |
| APPLICATION NO. | : 16/130692 | |
| DATED | : June 28, 2022 | |
| INVENTOR(S) | : Wei Chen et al. | |

It is certified that error appears in the above-identified patent and that said Letters Patent is hereby corrected as shown below:

In the Claims

In Claim 10, Column 44, Line 62, delete "generated the first compressed" and insert --generated first compressed--.

In Claim 13, Column 46, Line 10, delete "generated the first compressed" and insert --generated first compressed--.

Signed and Sealed this
Thirteenth Day of September, 2022

Katherine Kelly Vidal
*Director of the United States Patent and Trademark Office*